(12) United States Patent
Arie et al.

(10) Patent No.: US 8,242,605 B2
(45) Date of Patent: Aug. 14, 2012

(54) SEMICONDUCTOR DEVICE AND METHOD OF MANUFACTURING THE SAME

(75) Inventors: Hiroyuki Arie, Kanagawa (JP); Nobuaki Umemura, Kanagawa (JP); Nobuyoshi Hattori, Kanagawa (JP); Nobuto Nakanishi, Kanagawa (JP); Kimio Hara, Kanagawa (JP); Kyoya Nitta, Kanagawa (JP); Makoto Ishikawa, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 218 days.

(21) Appl. No.: 12/795,863

(22) Filed: Jun. 8, 2010

(65) Prior Publication Data
US 2010/0327349 A1 Dec. 30, 2010

(30) Foreign Application Priority Data
Jun. 29, 2009 (JP) ................... 2009-153254

(51) Int. Cl.
*H01L 23/48* (2006.01)
(52) U.S. Cl. ........ 257/774; 257/340; 257/505; 257/518; 257/554; 257/E29.256

(58) Field of Classification Search .................. 257/340, 257/505, 518, 554, 774, E29.256
See application file for complete search history.

(56) References Cited

U.S. PATENT DOCUMENTS
2003/0094669 A1   5/2003   Nakashima

FOREIGN PATENT DOCUMENTS
| JP | 2003-158178 A | 5/2003 |
| JP | 2004-103715 A | 4/2004 |
| JP | 2006-319282 A | 11/2006 |
| JP | 2007-53124 A | 3/2007 |

*Primary Examiner* — Tan N Tran
(74) *Attorney, Agent, or Firm* — Mattingly & Malur, PC

(57) ABSTRACT

In a semiconductor device having an LDMOSFET, a source electrode is at the back surface thereof. Therefore, to reduce electric resistance between a source contact region in the top surface and the source electrode at the back surface, a polysilicon buried plug is provided which extends from the upper surface into a P⁺-type substrate through a P-type epitaxial layer, and is heavily doped with boron. Dislocation occurs in a mono-crystalline silicon region around the poly-silicon buried plug to induce a leakage failure. The semiconductor device has a silicon-based plug extending through the boundary surface between first and second semiconductor layers having different impurity concentrations. At least the inside of the plug is a poly-crystalline region. Of the surface of the poly-crystalline region, the portions located on both sides of the foregoing boundary surface in adjacent relation thereto are each covered with a solid-phase epitaxial region.

10 Claims, 26 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2009-153254 filed on Jun. 29, 2009 including the specification, drawings and abstract is incorporated herein by reference in its entirety.

BACKGROUND OF THE INVENTION

The present invention relates to a technology which is effective when applied to a technique for burying a plug in a silicon-based semiconductor substrate in a structure of a semiconductor device (or a semiconductor integrated circuit device) and a method of manufacturing the same.

In Japanese Unexamined Patent Publication No. 2007-053124 (Patent Document 1), disclosed is a technology for an integrated circuit including a Laterally Diffused Metal Oxide Semiconductor Field Effect Transistor (LDMOSFET) in which a silicon-based buried plug of poly-silicon or the like is formed in a silicon-based mono-crystalline semiconductor substrate.

In Japanese Unexamined Patent Publication No. 2004-103715 (Patent Document 2), disclosed is a technology for an integrated circuit in which, to reduce the ON resistance of a bipolar transistor, a silicon-based buried plug is formed in a silicon-based mono-crystalline semiconductor substrate.

In Japanese Unexamined Patent Publication No. 2003-158178 (Patent Document 3) or US Patent Publication No. 2003-0094669 (Patent Document 4), disclosed is a technology which uses, as a conductive plug, a silicon-based insulating buried isolation region present in an isolation region for isolating a plurality of bipolar transistors.

In Japanese Unexamined Patent Publication No. 2006-319282 (Patent Document 5), as a technique for cleaning the surfaces of trenches formed in a silicon-based mono-crystalline semiconductor substrate, a technique is disclosed which cleans the surfaces of the trenches using a diluted fluoric acid solution or the like, and then cleans the surfaces of the trenches by wet cleaning using an acidic solution as the final step of cleaning except for a pure water rinsing step.

PRIOR ART DOCUMENTS

Patent Documents

[Patent Document 1]
Japanese Unexamined Patent Publication No. 2007-053124
[Patent Document 2]
Japanese Unexamined Patent Publication No. 2004-103715
[Patent Document 3]
Japanese Unexamined Patent Publication No. 2003-158178
[Patent Document 4]
US Patent Publication No. 2003-0094669
[Patent Document 5]
Japanese Unexamined Patent Publication No. 2006-319282

SUMMARY OF THE INVENTION

Unlike a typical vertical MOSFET, a Laterally Diffused MOSFET (LDMOSFET) uses the diffusion of an impurity in a lateral direction. The most characteristic feature of the LDMOSFET is that the back surface of a silicon-based semiconductor substrate (e.g., a P-type epitaxial mono-crystalline silicon substrate) serves as a source electrode (source external terminal). Moreover, since the LDMOSFET can operate in a class AB mode, a gate negative power source and the like are unnecessary. The LDMOSFET is also highly consistent with a CMOS process so that the LDMOSFET is principally used in an integrated circuit such as an RF amplifier.

In a semiconductor device having an LDMOSFET, the source electrode is at the back surface thereof. Therefore, to reduce electric resistance between a source contact region in the top surface of the semiconductor device and the source electrode at the back surface thereof, a poly-silicon buried plug is provided which extends from the upper surface into the $P^+$-type substrate through a P-type epitaxial layer, and is heavily doped with boron.

The present inventors have studied the poly-silicon buried plug, and proved that dislocation has occurred in a mono-crystalline silicon region around the buried plug, and induced a leakage failure. The present inventors have analyzed the cause of the dislocation, and proved that, due to a natural oxide film produced over the inner surface of a hole for the poly-silicon buried plug, the solid-phase epitaxial growth of the poly-silicon buried plug has become unequal, and a stress therefrom has caused the dislocation around the poly-silicon buried plug to consequently induce the leakage failure.

The present invention has been achieved in order to solve these problems.

An object of the present invention is to provide a semiconductor device with high reliability, and a manufacturing process therefor.

The above and other objects and novel features of the present invention will become apparent from a statement in the present specification and the accompanying drawings.

The following is a brief description of the outline of a representative aspect of the invention disclosed in the present application.

That is, an aspect of the present invention is a semiconductor device having a silicon-based plug extending through the boundary surface between first and second semiconductor layers having different impurity concentrations such as the boundary surface between a silicon-based mono-crystalline substrate layer (having, e.g., a P-type conductivity) and an epitaxial substrate. At least the inside of the plug is a poly-crystalline region, and the portions of the surface of the poly-crystalline region located on both sides of the foregoing boundary surface in adjacent relation thereto are covered with a solid-phase epitaxial region.

The following is a brief description of effects achievable by the representative aspect of the invention disclosed in the present application.

That is, in the semiconductor device having the silicon-based plug extending through the boundary surface between the first and second semiconductor layers having different impurity concentrations such as the boundary surface between the silicon-based mono-crystalline substrate layer and the epitaxial substrate, at least the inside of the plug is a poly-crystalline region, and the portions of the surface of the poly-crystalline region located on both sides of the foregoing boundary surface in adjacent relation thereto are covered with the solid-phase epitaxial region so that an undesired stress does not occur around the plug.

DETAILED DESCRIPTION OF THE PREFERRED EMBODIMENTS

Outline of Embodiments

Figure 1:
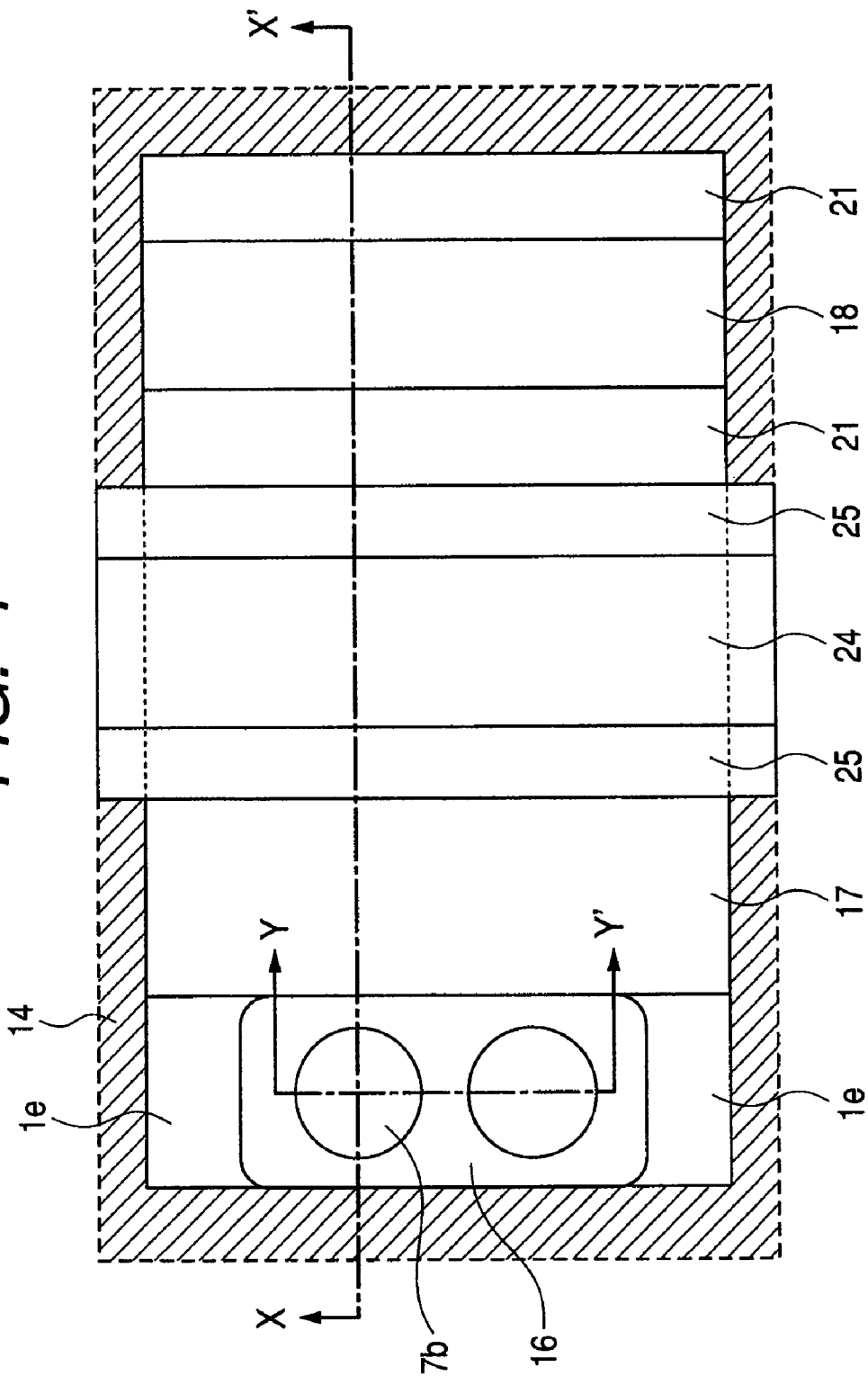
FIG. 1 is a schematic plan view (at the time when a gate electrode structure is completed) of an LDMOSFET portion in a semiconductor device according to an embodiment of the present invention.

First, a description will be given of the outline of representative embodiments of the invention disclosed in the present application.

1. A semiconductor device includes: (a) a semiconductor substrate comprised of a silicon-based single crystal of a first conductivity type, and having a first main surface and a second main surface; (b) a first semiconductor layer provided closer to the second main surface in the semiconductor substrate, and having a first impurity concentration; (c) a second semiconductor layer provided closer to the first main surface in the semiconductor substrate so as to come in contact with the first semiconductor layer, and having a second impurity concentration; and (d) a silicon-based plug extending from the first main surface through the second semiconductor layer to reach an inside of the first semiconductor layer, wherein the plug includes: (d1) a poly-crystalline region in a center portion thereof; and (d2) a solid-phase epitaxial region including a boundary region between the first and second semiconductor layers, and formed in a vicinity of the boundary in a direction extending between the first and second main surfaces so as to cover a periphery of the poly-crystalline region.

2. In the semiconductor device defined in Article 1 shown above, the first conductivity type is a P-type.

3. In the semiconductor device defined in Article 1 or 2 shown above, the plug is doped with boron.

4. In the semiconductor device defined in any one of Articles 1 to 3 shown above, the second semiconductor layer is an epitaxial layer.

5. In the semiconductor device defined in any one of Articles 1 to 4 shown above, the first impurity concentration is higher than the second impurity concentration.

6. In the semiconductor device defined in any one of Articles 1 to 5 shown above, a boron concentration of the plug is higher than the first impurity concentration.

7. In the semiconductor device defined in any one of Articles 1 to 6 shown above, a length of the portion of the solid-phase epitaxial layer extending from the boundary to the first main surface and a length of the portion of the solid-phase epitaxial layer extending from the boundary to the second main surface are each 200 nm or more.

8. In the semiconductor device defined in any one of Articles 1 to 6 shown above, the poly-crystalline region is covered with the solid-phase epitaxial region except for an upper surface thereof closer to the first main surface.

9. In the semiconductor device defined in any one of Articles 1 to 8 shown above, the first impurity concentration is 1000 times or more higher than the second impurity concentration.

10. In the semiconductor device defined in any one of Articles 1 to 9 shown above, an upper end of the plug is coupled to a $P^+$-type contact region of an LDMOSFET.

11. A method of manufacturing a semiconductor device, includes the following steps of: (a) preparing a semiconductor wafer comprised of a silicon-based single crystal of a first conductivity type, and having a first semiconductor layer having a first impurity concentration and a second semiconductor layer having a second impurity concentration, and abutting the first semiconductor layer; (b) forming a hole for a buried plug extending from a first main surface of the wafer which is closer to the second semiconductor layer through the second semiconductor layer toward a second main surface of the wafer which is closer to the first semiconductor layer to reach an inside of the first semiconductor layer; (c) removing a silicon-based oxide film from an inner surface of the hole; (d) after the step (c), burying a poly-silicon member in the hole in a state where there is substantially no silicon-based oxide film over the inner surface of the hole; and (e) after the step (d), performing a thermal process at a temperature of 800° C. or more with respect to the wafer.

12. In the method of manufacturing the semiconductor device defined in Article 11 shown above, the first conductivity type is a P-type.

13. In the method of manufacturing the semiconductor device defined in Article 11 or 12 shown above, the poly-silicon member is doped with boron.

14. In the method of manufacturing the semiconductor device defined in any one of Articles 11 to 13 shown above, the second semiconductor layer is an epitaxial layer.

15. In the method of manufacturing the semiconductor device defined in any one of Articles 11 to 14 shown above, the first impurity concentration is higher than the second impurity concentration.

16. In the method of manufacturing the semiconductor device defined in any one of Articles 11 to 15 shown above, a boron concentration of the poly-silicon member is higher than the first impurity concentration.

17. In the method of manufacturing the semiconductor device defined in any one of Articles 11 to 16 shown above, the first impurity concentration is 1000 times or more higher than the second impurity concentration.

18. In the method of manufacturing the semiconductor device defined in any one of Articles 11 to 17 shown above, an upper end of the poly-silicon member is coupled to a $P^+$-type contact region of an LDMOSFET.

19. In the method of manufacturing the semiconductor device defined in any one of Articles 11 to 18 shown above, the step (c) includes the following sub-step of: (c1) cleaning the inner surface of the hole using a diluted hydrofluoric acid at a temperature of 70° C. or more and less than 90° C.

20. In the method of manufacturing the semiconductor device defined in any one of Articles 11 to 19 shown above, the step (c) includes the following sub-step of: (c2) performing a plasma process with respect to the inner surface of the hole using a reductive gas atmosphere containing hydrogen as a main component thereof.

21. In the method of manufacturing the semiconductor device defined in any one of Articles 11 to 20 shown above, the step (c) includes the following sub-steps of: (c3) cleaning the inner surface of the hole using a cleaning solution containing a nitric acid at an ordinary temperature as a main component thereof and a hydrofluoric acid added thereto; and (c4) after the sub-step (c3), cleaning the inner surface of the hole using a diluted hydrofluoric acid at an ordinary temperature for 1 minute or more.

22. In the method of manufacturing the semiconductor device defined in any one of Articles 11 to 21 shown above, after the step (e), the poly-silicon member in the hole is crystal-grown into a solid-phase epitaxial state.

Explanation of Description Form, Basic Terminology, and Use thereof in Present Invention 1. In the present invention, if necessary for the sake of convenience, an embodiment may be divided into a plurality of sections in the description thereof. However, they are by no means independent of or distinct from each other unless particularly explicitly described otherwise, and one of the individual parts of a single example is details, variations, and so forth of part or the whole of the others. In principle, the repetition of like parts will be omitted. Each constituent element in the embodiment is not indispensable unless particularly explicitly described otherwise, unless the constituent element is theoretically limited to a specific number, or unless it is obvious from the context that the constituent element is indispensable.

Further, when a "semiconductor device" or "semiconductor integrated circuit device" is mentioned in the present invention, it principally refers to a semiconductor device or semiconductor integrated circuit in which, in addition to various single-element transistors (active elements) and various transistors which are main components, resistors, capacitors, and the like are integrated over a semiconductor chip or the like (such as, e.g., a mono-crystalline silicon substrate). Here, as an exemplary representative of the various transistors, there can be shown a Metal Insulator Semiconductor Field Effect Transistor (MISFET) represented by a Metal Oxide Semiconductor Field Effect Transistor (MOSFET). At this time, as an exemplary representative of an integrated circuit structure, there can be shown a Complementary Metal Insulator Semiconductor (CMIS) integrated circuit represented by a Complementary Metal Oxide Semiconductor (CMOS) integrated circuit which is a combination of an N-channel MISFET and a P-type MISFET.

In general, a wafer process for a present-day semiconductor integrated circuit device can be roughly sub-divided into a Front End of Line (FEOL) process from the loading of a silicon wafer as a raw material to a Premetal process (process including the formation of an interlayer insulating film between the lower end of a MI wiring layer and a gate electrode structure or the like, the formation of a contact hole, the burying of a tungsten plug, and the like) or the like and a Back End of Line (BEOL) process starting with the formation of the MI wiring layer, and ending at the formation of a pad opening in a final passivation film over an aluminum-based pad electrode or the like (a wafer-level packaging process is also included in the BEOL process). In the FEOL process, a gate electrode patterning step, the contact hole forming step, and the like are microfabrication steps in which particularly fine fabrication is required. On the other hand, in the BEOL process, microfabrication is particularly required in the step of forming vias and wires, especially a local wire in a relatively low layer and the like.

2. Likewise, even when such wording as "X comprised of A" is used in association with a material, a composition, or the like in the description of the embodiment or the like, it does not exclude a material, a composition, or the like which contains an element other than A as one of the main constituent elements thereof unless particularly explicitly described otherwise, or unless it is obvious from the context that it excludes such a material, a composition, or the like. For example, when a component is mentioned, the wording means "X containing A as a main component" or the like. It will be appreciated that, even when "silicon member" or the like is mentioned, it is not limited to pure silicon, and a member containing a SiGe alloy, another multi-element alloy containing silicon as a main component, another additive, or the like is also included. Likewise, it will also be appreciated that, even when "silicon oxide film" or "silicon-oxide-based insulating film" is, it includes not only a relatively pure undoped silicon dioxide, but also a thermal oxide film of Fluorosilicate Glass (FSG), TEOS-based silicon oxide, Silicon Oxicarbide (SiOC), Carbon-doped Silicon oxide, Organosilicate glass (OSG), Phosphorus Silicate Glass (PSG), Borophosphosilicate Glass (BPSG), or the like, a CVD oxide film, a coated silicon oxide such as Spin ON Glass (SOG) or Nano-Clustering Silica (NCS), a silica-based Low-k insulating film (porous insulating film) obtained by introducing voids into the same member as mentioned above, a composite film with another silicon-based insulating film which contains any of these mentioned above as a main constituent element thereof, and the like.

As a silicon-based insulating film commonly used in a semiconductor field along with a silicon-oxide-based insulating film, there is a silicon-nitride-based insulating film. Materials of this type include SiN, SiCN, SiNH, and SiCNH. Here, when a "silicon nitride" is mentioned, it includes both of SiN and SiNH unless it is shown particularly explicitly that the "silicon nitride" does not include both of SiN and SiNH. Likewise, when "SiCN" is mentioned, it includes both of SiCN and SiCNH unless it is shown particularly explicitly that "SiCN" does not include both of SiCN and SiCNH.

SiC has properties similar to those of SiN but, in most cases, SiON should be rather categorized into a silicon-oxide-based insulating film.

3. Likewise, it will also be appreciated that, although a preferred example is shown in association with a graphical figure, a position, an attribute, or the like, the graphical figure, position, or attribute is not strictly limited thereto unless particularly explicitly described otherwise, or unless it is obvious from the context that the graphical figure, position, or attribute is strictly limited thereto.

4. Further, when a specific numerical value or numerical amount is mentioned, it may be either more or less than the specific numerical value unless particularly explicitly described otherwise, unless the numerical value is theoretically limited to the number, or unless it is obvious from the context that the numeral value is limited to the number.

5. When a "wafer" is mentioned, it typically refers to a mono-crystalline silicon wafer on which a semiconductor device (the same as a semiconductor integrated circuit device or an electronic device) is formed, but it will be appreciated that the "wafer" also includes a composite wafer of an insulating substrate and a semiconductor layer or the like, such as an epitaxial wafer, a SOI substrate, or an LCD glass substrate.

6. When "Poly-Silicon", "Poly-Crystalline Silicon", or the like is mentioned, it also includes an amorphous-silicon-based member in addition to a typical poly-crystalline-silicon-based member unless it is shown particularly explicitly that "Poly-Silicon", "Poly-Crystalline Silicon", or the like does not include an amorphous-silicon-based member or unless it is obvious that "Poly-Silicon", "Poly-Crystalline Silicon", or the like does not include an amorphous-silicon-based member. This is because the boundary between a poly-crystalline state and an amorphous state is not necessarily distinct.

In the present invention, a "solid-phase epitaxial region" associated with a silicon-based plug indicates a region where a solid-phase epitaxial process has progressed, and a "poly-crystalline region" associated with the silicon-based plug indicates a region where the solid-phase epitaxial process has not substantially progressed.

7. When an "ordinary temperature" or "room temperature" is mentioned in the present invention, 25° C. is used as a reference, and the "ordinary temperature" or "room temperature" indicates a temperature range of about 15 to 35° C.

DETAILED DESCRIPTION OF EMBODIMENT

An embodiment of the present invention will be further described in detail. In each of the drawings, the same or similar parts are denoted by the same or similar marks or reference numerals, and a description thereof will not be repeated in principle.

In the accompanying drawings, hatching or the like may be omitted even in a cross section when hatching or the like results in complicated illustration or when the distinction between the section to be hatched and a vacant space is distinct. In relation thereto, even a two-dimensionally closed hole have a background outline thereof omitted when it is obvious from the description or the like that the hole is two-dimensionally closed and so on. On the other hand, even a portion other than a cross section may be hatched to clearly show that the hatched portion is not a vacant space.

1. Description of Principal-Portion Outline of Semiconductor Device and Manufacturing Method thereof in Embodiment of Present Invention, etc. (Principally from FIGS. 19 to 26).

Figure 19:
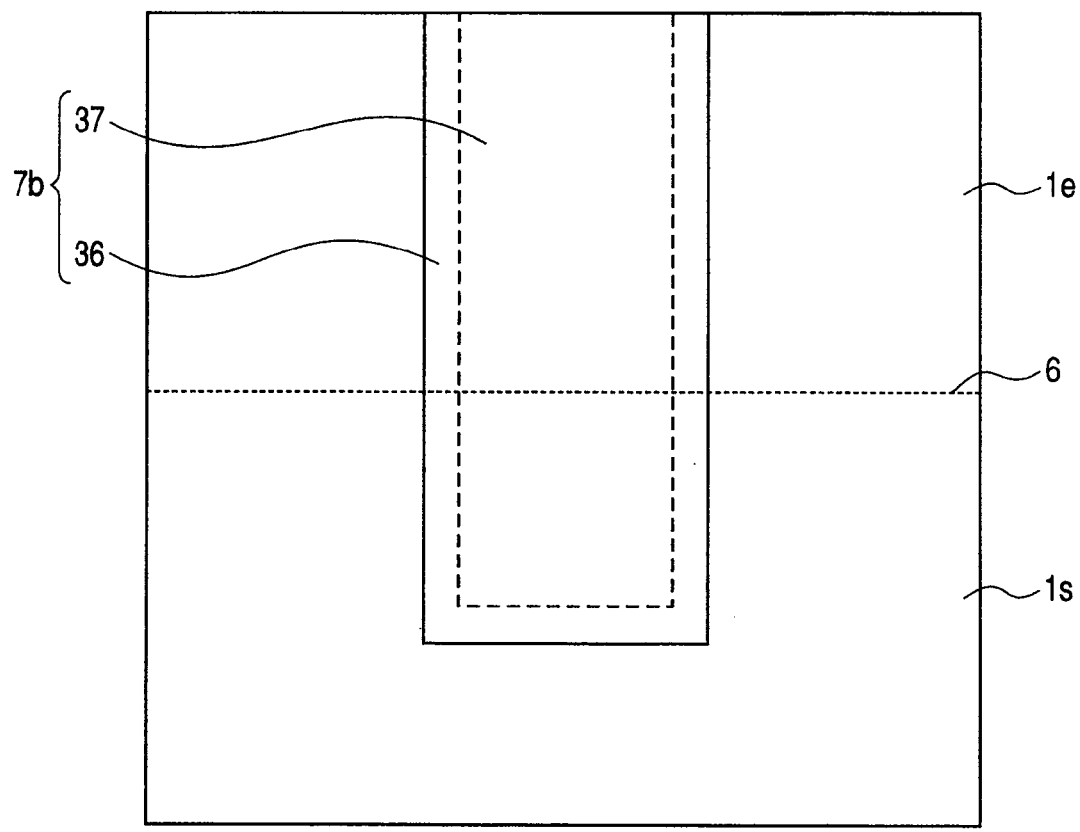
FIG. 19 is a cross-sectional structural view (Example 1) of a poly-silicon plug of an LDMOSFET portion and a peripheral portion thereof in the semiconductor device according to the embodiment of the present invention.
Figure 20:
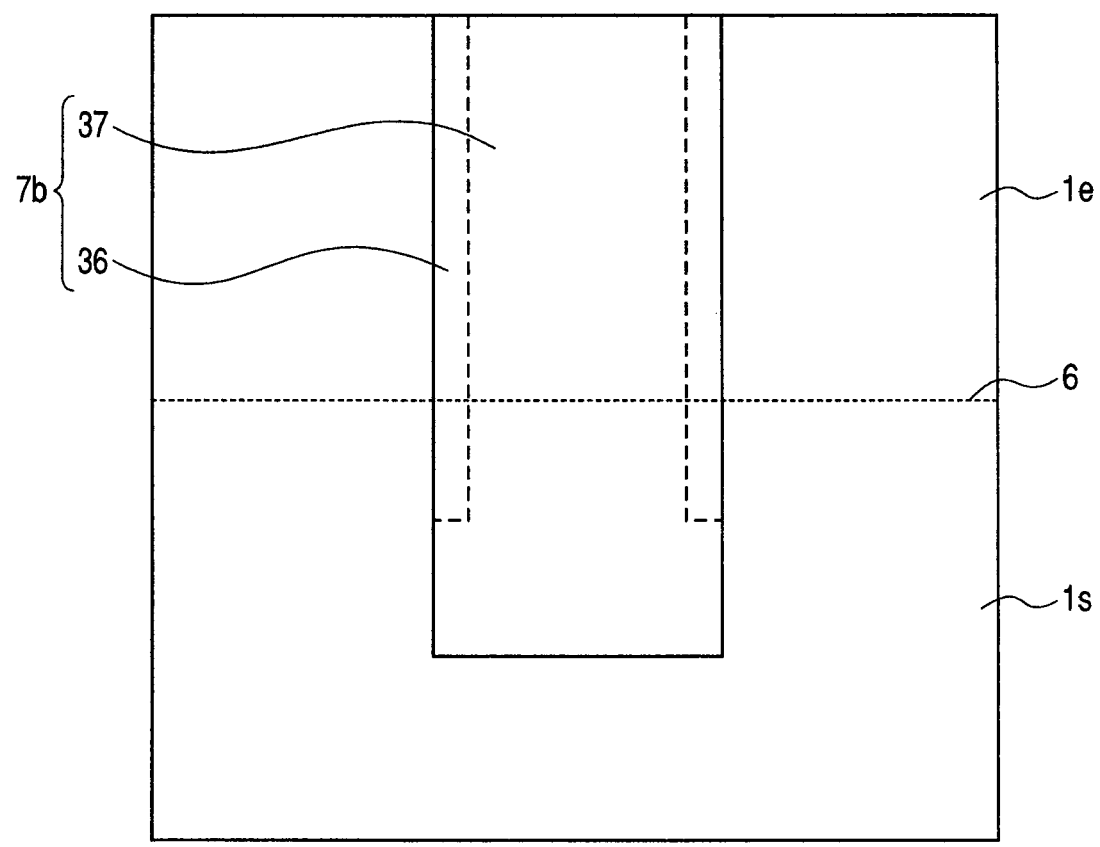
FIG. 20 is a cross-sectional structural view (Example 2) of the poly-silicon plug of the LDMOSFET portion and the peripheral portion thereof in the semiconductor device according to the embodiment of the present invention.
Figure 21:
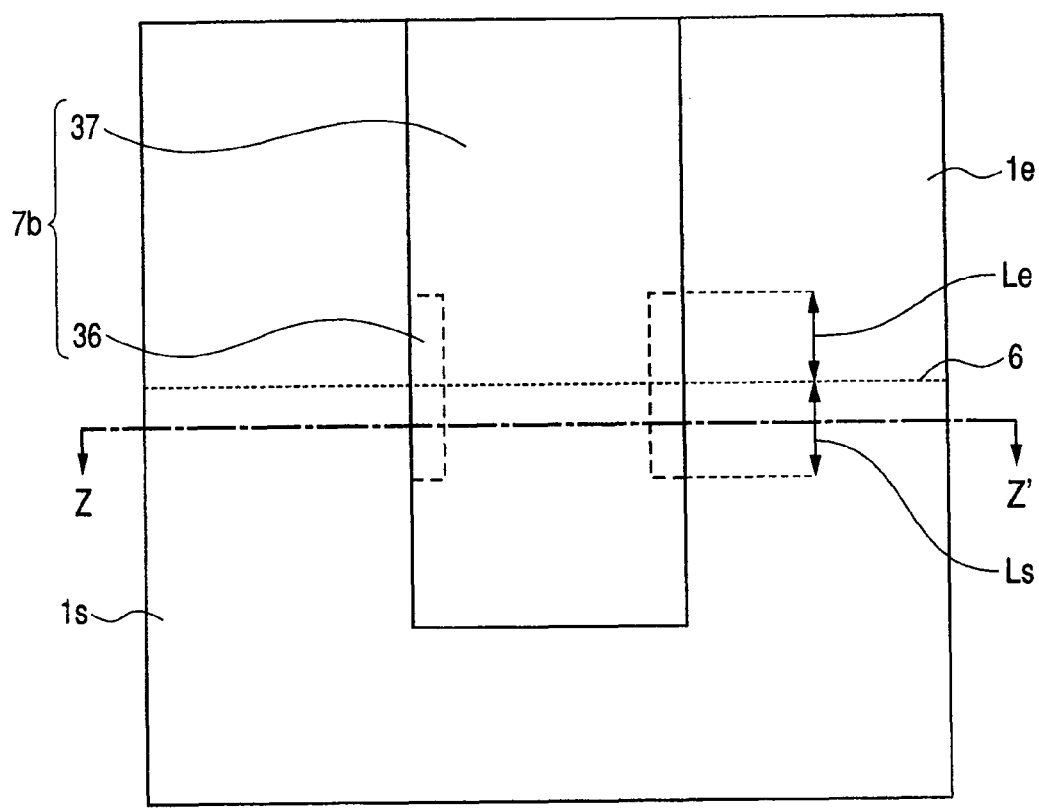
FIG. 21 is a cross-sectional structural view (Example 3) of the poly-silicon plug of the LDMOSFET portion and the peripheral portion thereof in the semiconductor device according to the embodiment of the present invention.
Figure 22:
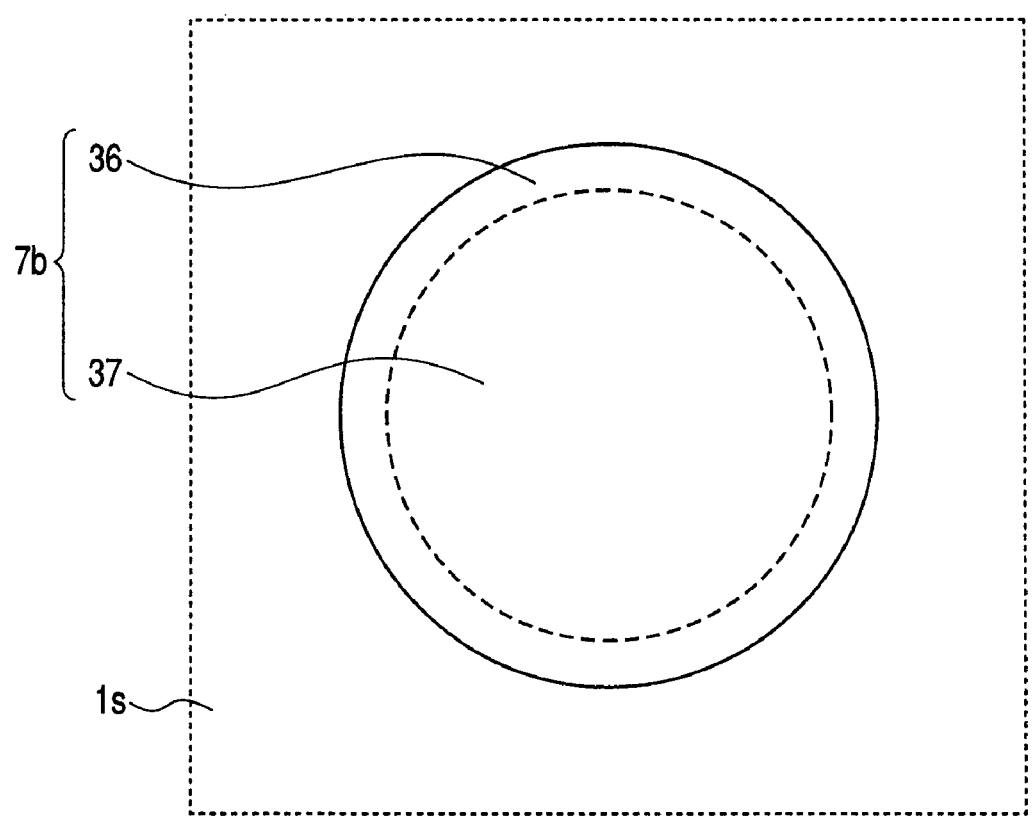
FIG. 22 is a cross-sectional view along the line Z-Z' of FIG. 21.
Figure 23:
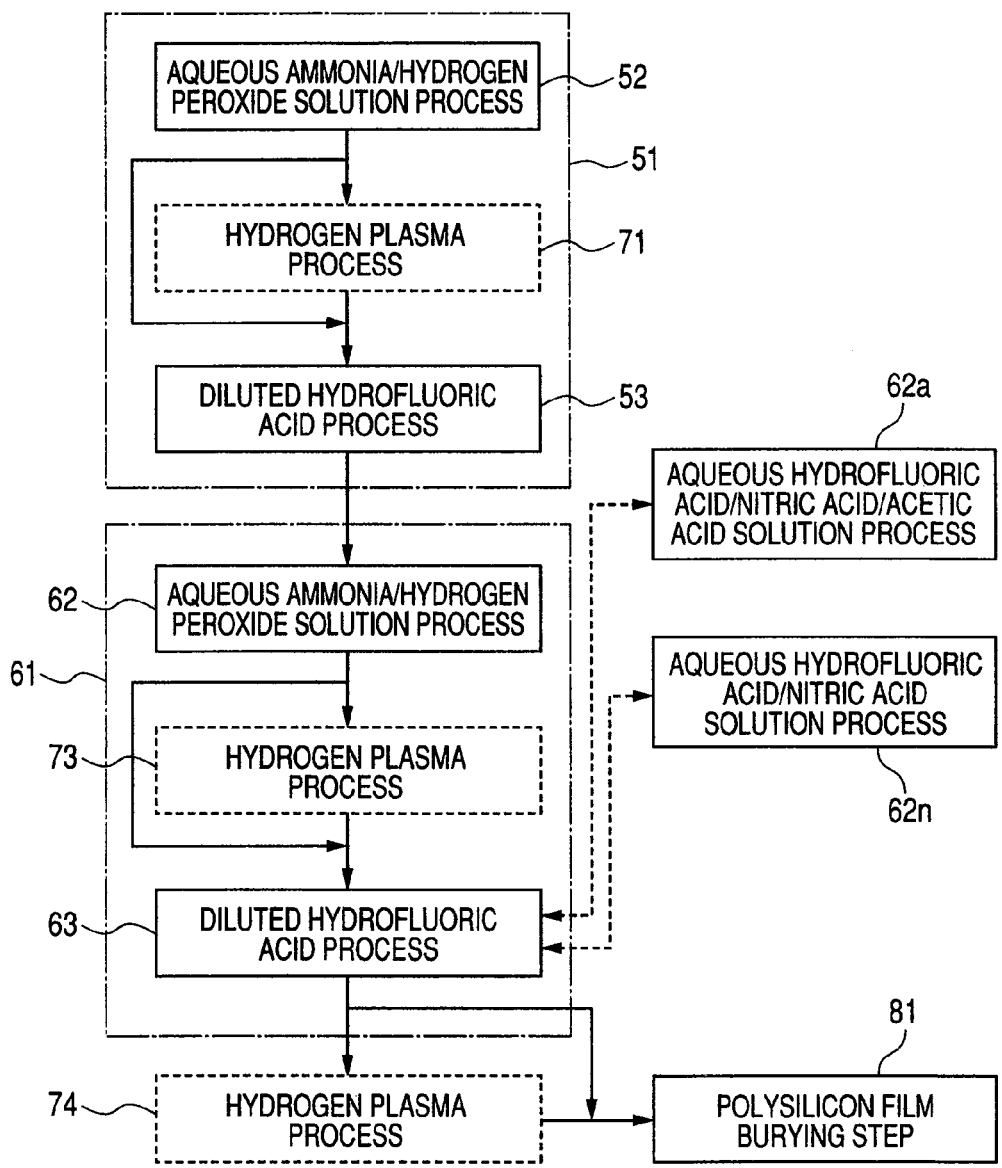
FIG. 23 is a process block flow chart of a cleaning step prior to the burying of the poly-silicon plug and the steps prior and subsequent thereto in the method of manufacturing the semiconductor device according to the embodiment of the present invention.
Figure 24:
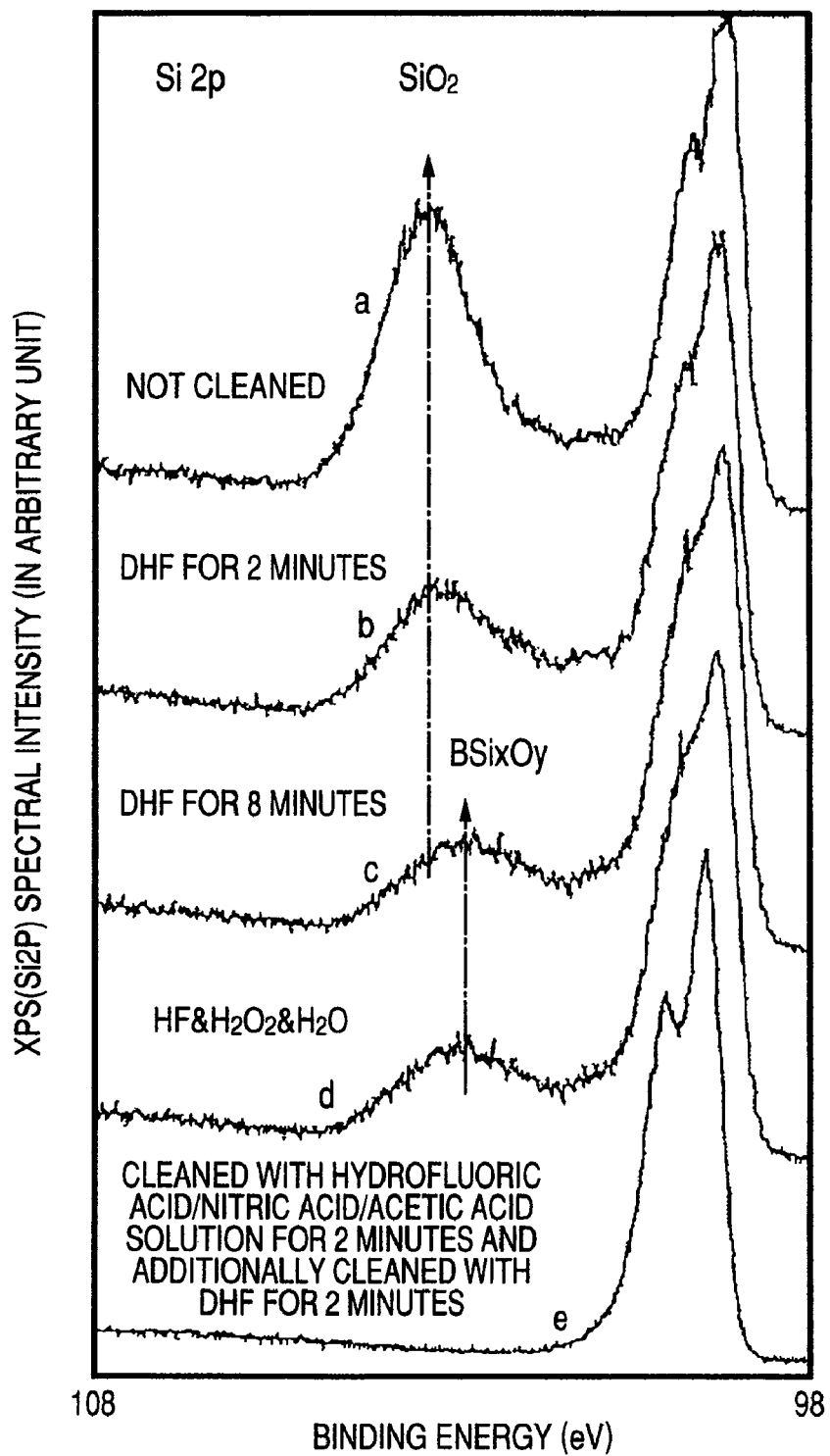
FIG. 24 is an X-Ray Photoelectron Spectroscopic (XPS) data plot diagram showing the relationship between conditions for the cleaning prior to the burying of the poly-silicon plug and a remaining silicon oxide film (including $SiO_2$, $BSi_xO_y$, or the like) in the method of manufacturing the semiconductor device according to the embodiment of the present invention.
Figure 25:
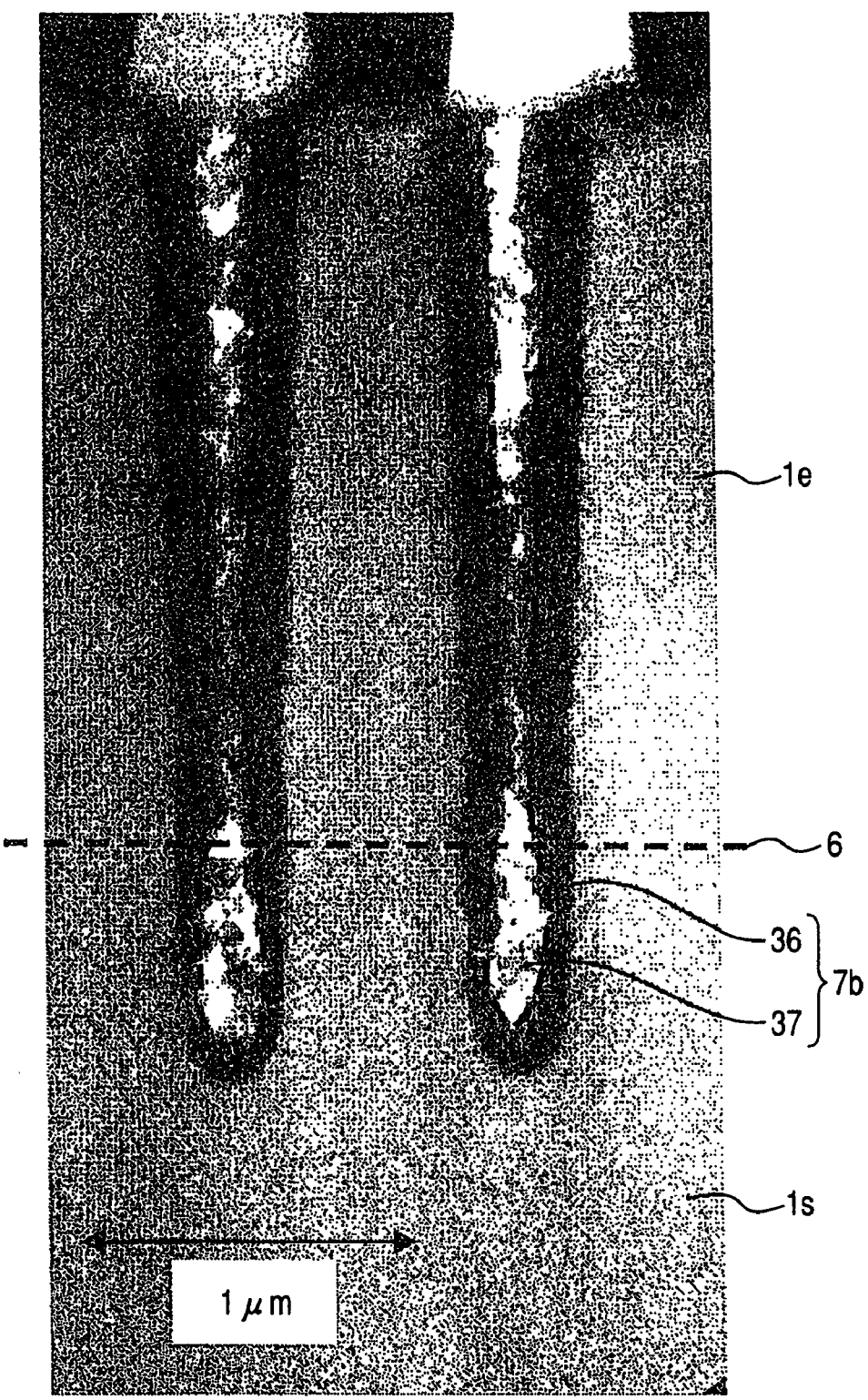
FIG. 25 is a Transmission Electron Micrograph (TEM) of the device (semiconductor device according to the embodiment of the present invention) corresponding to a cross section along the line Y-Y' of FIG. 1.
Figure 26:
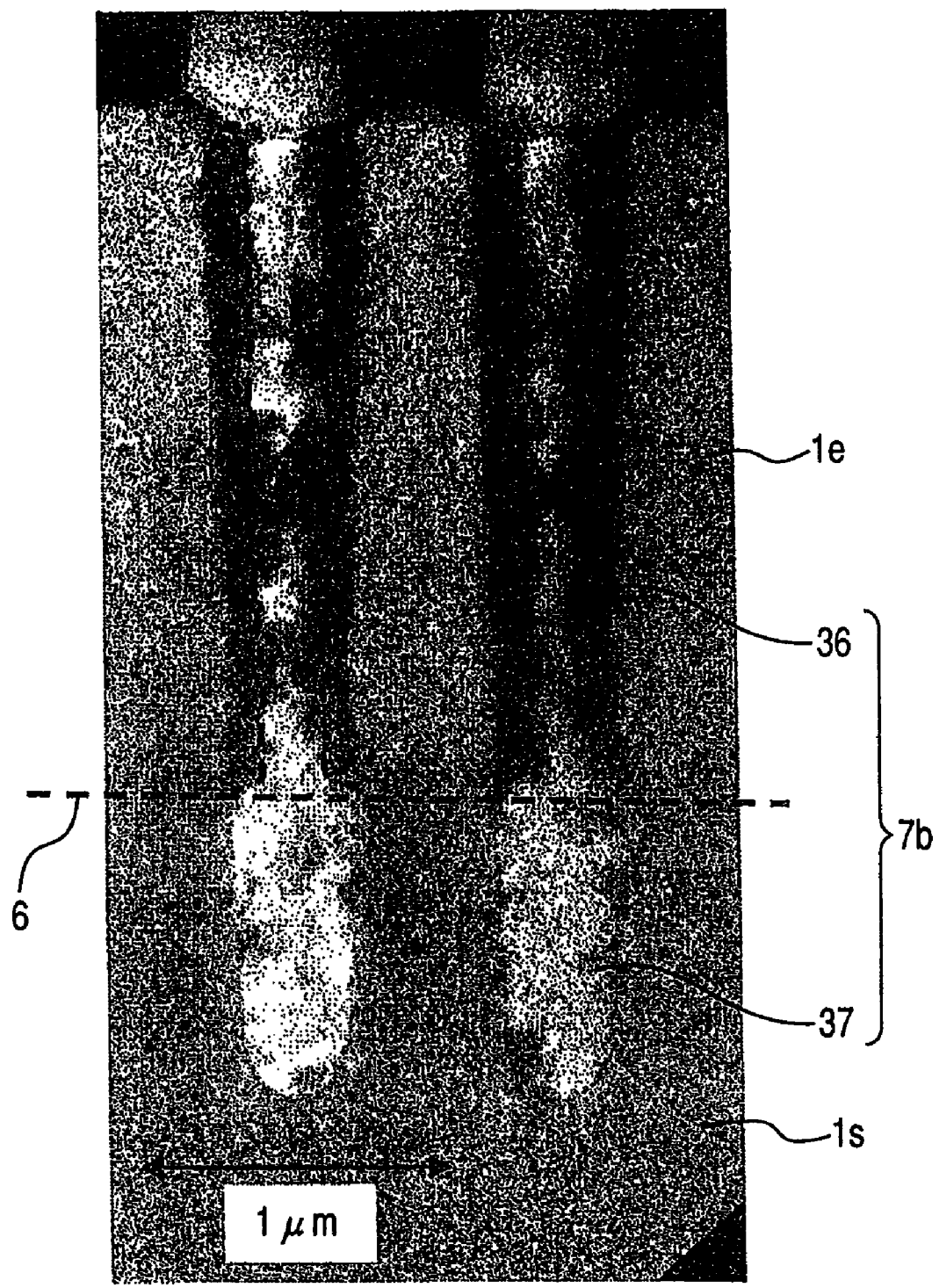
FIG. 26 is a Transmission Electron Micrograph (TEM) of a device (comparative example) corresponding to the cross section along the line Y-Y' of FIG. 1.

FIG. 19 is a cross-sectional structural view (Example 1) of a poly-silicon plug of an LDMOSFET portion and a peripheral portion thereof in a semiconductor device according to the embodiment of the present invention. FIG. 20 is a cross-sectional structural view (Example 2) of a poly-silicon plug of the LDMOSFET portion and a peripheral portion thereof in the semiconductor device according to the embodiment of the present invention. FIG. 21 is a cross-sectional structural view (Example 3) of a poly-silicon plug of the LEMOSFET portion and a peripheral portion thereof in the semiconductor device according to the embodiment of the present invention. FIG. 22 is a cross-sectional view along the line Z-Z' of FIG. 21. FIG. 23 is a process block flow chart of a cleaning step prior to the burying of the poly-silicon plug and the steps prior and subsequent thereto in the method of manufacturing the semiconductor device according to the embodiment of the present invention. FIG. 24 is an X-ray Photoelectron Spectroscopic (XPS) data plot diagram showing the relationship between conditions for the cleaning prior to the burying of the poly-silicon plug and a remaining silicon oxide film (including SiO2, BSixOy, or the like) in the method of manufacturing the semiconductor device according to the embodiment of the present invention. FIG. 25 is a Transmission Electron Micrograph (TEM) of a device (semiconductor device according to the embodiment of the present invention) corresponding to a cross section along the line Y-Y' of FIG. 1. FIG. 26 is a Transmission Electron Micrograph (TEM) of a device (comparative example) corresponding to the cross section along the line Y-Y' of FIG. 1. Based on these drawings, a description will be given of the principal-portion outline of the semiconductor device and the manufacturing method thereof according to the embodiment of the present invention and so forth.

FIG. 26 shows, as the comparative example, the device that has been subjected to a standard cleaning method for a process of cleaning the inner surface of a buried plug hole (via hole) in which a poly-silicon plug 7b is to be buried. In accordance with the standard method used herein, cleaning (first step mainly for removing particles and organic contamination) using an aqueous ammonia/hydrogen peroxide mixed solution (at a volume ratio of $NH_3:H_2O_2:H_2O=0.2:1:10$) at a temperature of 50° C. was performed for 15 minutes and, subsequently, cleaning (second step mainly for removing a natural oxide film) using a diluted hydrofluoric acid (at a volume ratio of $HF:H_2O=1:500$) at a temperature of 80° C. was performed for 5 minutes. As can be seen from FIG. 26, the buried plug 7b extends from the top surface of a P-type epitaxial layer 1e at a relatively low concentration through the epitaxial layer 1e to reach the inside of a $P^+$-type monocrystalline silicon substrate layer is at a relatively high concentration. Here, over the boundary 6 between the epitaxial layer 1e and the silicon substrate portion 1s, the entire poly-silicon plug 7b (buried plug) is separated in an inner poly-crystalline region 37 (white portion) and an outer solid-phase epitaxial region 36 (black portion). On the other hand, under the boundary 6 between the epitaxial layer 1e and the silicon substrate portion 1s, substantially the entire poly-silicon plug 7b has become the poly-crystalline region 37 (white portion).

This may be conceivably because, at the surface of the buried plug 7b in the silicon substrate portion 1s, the progression of a solid-phase epitaxial process is inhibited. That is, it has been proved by the present inventors that, in a region heavily doped with boron as an impurity, an oxidation growth speed tends to be higher, and a natural oxide film is more likely to be produced. With regard to this, FIG. 24 shows XPS data showing the relationship between various cleaning specifications and the natural oxide film remaining over the surface of silicon doped with boron. In accordance with a method of cleaning samples, cleaning (first step) using an aqueous ammonia/hydrogen peroxide mixed solution (at a volume ratio of $NH_3:H_2O_2:H_2O=0.2:1:10$) at a temperature of 50° C. was performed for 5 minutes and, subsequently, the individual samples were subjected to processes (second steps) according to the following specifications. That is, (1) the sample a was not subjected to any second step (reference sample), (2) the sample b was cleaned with a diluted hydrofluoric acid (DHF) at a composition volume ratio of $HF:H_2O=1:99$ and a temperature of 80° C. for 2 minutes, (3) the sample c was cleaned with a diluted hydrofluoric acid (DHF) at a composition volume ratio of $HF:H_2O=1:99$ and a temperature of 80° C. for 8 minutes, (4) the sample d was cleaned with an aqueous hydrofluoric acid/hydrogen peroxide mixed solution at a composition volume ratio of $HF:H_2O_2:H_2O=1:2:100$ (at an ordinary temperature) for 2 minutes, and (5) the sample e was cleaned with a hydrofluoric acid/nitric acid/ascetic acid mixed solution at a composition volume ratio of $HF:HNO_3:CH_3COOH=1:50:50$ (at an ordinary temperature) for 2 minutes, and additionally cleaned with a diluted hydrofluoric acid (DHF) at a composition volume ratio of $HF:H_2O=1:100$ (at an ordinary temperature) for 2 minutes.

From FIG. 24, the following can be seen. That is, in the process using the hydrofluoric-acid-based solution not containing an oxidizer, even when cleaning was performed for 8 minutes, the natural oxide film slightly remained. The degree to which the natural oxide film remained is equal to that in the process using the hydrofluoric-acid/hydrogen-peroxide-based solution containing an oxidizer. It can be considered that the remaining of the natural oxide film inhibited the progression of the solid-phase epitaxial process. Therefore, in a cleaning step 61 prior to the burying of the poly-silicon plug of FIG. 23, it is important to remove the natural oxide film in a buried plug hole (via hole) 5 substantially completely. From the gap between the abscissa values and the difference between data from the samples b and c, it can be considered that the remaining component is not $SiO_2$, but $BSi_xO_y$ or the like (it can be considered that $BSi_xO_y$ is harder to remove than typical $SiO_2$). Furthermore, the use of a hydrofluoric-acid/nitric-acid-based cleaning solution having a property of etching silicon or the like allowed the natural oxide film to be removed more efficiently in a relatively short time. Accordingly, in the case of using a hydrofluoric-acid-based solution not containing an oxidizer, a 10 minute or longer process becomes necessary (note that, as described below, by adding cleaning using a nitric-acid-based solution, it is possible to reduce the time of the diluted hydrofluoric acid process and the temperature of the solution).

From the data, the following is obvious. That is, (1) in the cleaning step 61 prior to the burying of the poly-silicon plug of FIG. 23, the cleaning process is performed by performing the first step mainly for removing particles and organic contamination such as an aqueous ammonia/hydrogen peroxide solution process 62 and the second step for removing a natural oxide film using the hydrofluoric-acid-based cleaning solution (e.g., diluted hydrofluoric acid, i.e., DHF) not containing an oxidizer for a relatively long time. For example, if the diluted hydrofluoric acid has a composition volume ratio of $HF:H_2O=1:500$ (at a temperature of 80° C.), the cleaning process is performed for 10 minutes or more, preferably 12 minutes or more, or, e.g., about 15 minutes. The reason for increasing the temperature of the diluted hydrofluoric acid herein is that a diluted hydrofluoric acid at a temperature of 70° C. or more is considered to be more effective in completely removing the natural oxide film than a diluted hydrofluoric acid at an ordinary temperature.

Note that the aqueous ammonia/hydrogen peroxide solution is not limited to the foregoing composition (volume ratio of $NH_3:H_2O_2:H_2O=0.2:1:10$), and may also be APM (at a volume ratio of $NH_3:H_2O_2:H_2O=1:1:5$ and a solution temperature of about 70 to 80° C.) used in RCA cleaning performed (for about 10 minutes) or another cleaning solution. (2) As a substitute method for the diluted hydrofluoric acid cleaning in the step (2), a method using a hydrofluoric-acid/nitric-acid-based cleaning solution may also be implemented (the second step is further divided into two sub-steps).

As specific examples, the following two can be shown. That is, (2-1) after a process is performed using an aqueous hydrofluoric acid/nitric acid solution (at a volume ratio of $HF:HNO_3:H_2O=1:500:250$ and an ordinary temperature) for about 10 seconds, a process is performed using a diluted hydrofluoric acid at a composition volume ratio of $HF:H_2O=1:500$ (at a temperature of 25° C., i.e., ordinary temperature) for about 2 minutes. (aqueous hydrofluoric acid/nitric acid solution process 62n of FIG. 23) (2-2) After a process is performed using an aqueous hydrofluoric acid/nitric acid/acetic acid solution (at a volume ratio of $HF:HNO_3:CH_3COOH:H_2O=1:70:75:30$ and an ordinary temperature) for about 2 minutes, a process is performed using a diluted hydrofluoric acid at a composition volume ratio of $HF:H_2O=1:100$ (at a temperature of 25° C., i.e., ordinary temperature) for about 2 minutes. (aqueous hydrofluoric acid/nitric acid/acetic acid solution process 62a of FIG. 23)

It can be considered that, as in the two examples shown herein, a solution containing a nitric acid as a main component thereof and a hydrofluoric acid added thereto has a high property of etching a silicon surface (higher than that of an ammonia/hydrogen-peroxide-based solution) and a high ability to remove an extraordinary natural oxide film. Accordingly, cleaning including these two nitric-acid-based solution processes as main elements thereof is characterized in that, after the cleaning process is performed at an ordinary temperature using the solution containing the nitric acid as the main component thereof and the hydrofluoric acid added thereto, the cleaning process is performed using, e.g., a diluted hydrofluoric acid at an ordinary temperature for 1 minute or more. (3) In (1) and (2), prior to the final diluted hydrofluoric acid process, a hydrogen plasma process 73 (plasma process in a reductive gas containing hydrogen as a main component thereof) may also be performed (note that this process is not mandatory). This allows a reduction in the time of the final diluted hydrofluoric acid process. Alternatively, a hydrogen process 74 may also be performed after the final diluted hydrofluoric acid process. The hydrogen plasma process 73 or 74 achieves the effect described above as long as it is performed at least once. Examples of conditions for the hydrogen plasma process 73 or 74 (substantially the same as for a hydrogen plasma process 71) that can be shown include a wafer stage temperature of about 400° C. (from 350° C. to 450° C.), a process time of about 60 seconds (from 40 seconds to 90 seconds), a hydrogen flow rate of about 300 sccm, an argon flow rate of about 200 sccm, and an RF power of about 750 watts (an applied RF frequency of 350 kHz).

Here, using FIG. 23, a description will be given of a process block flow of the cleaning step prior to the burying of the poly-silicon plug and the steps prior and subsequent thereto in the method of manufacturing the semiconductor device according to the embodiment of the present invention.

As shown in FIG. 23, before the cleaning step 61 prior to the burying of the poly-silicon plug, there is a cleaning step 51 after the formation of the buried plug hole. Note that the step of forming the buried plug hole will be described in Section 2. The cleaning step 51 after the formation of the buried plug hole is for removing various contamination and an undesired oxide film each formed during the step of forming the buried plug hole, and can include, e.g., an aqueous ammonia/hydrogen peroxide solution process 52, a diluted hydrofluoric acid process 53 subsequent thereto, and the like. It will be appreciated that, between the cleaning processes using the different chemical solutions, a pure water rinsing process is performed and, after the final one (which is herein the diluted hydrofluoric acid process 53) of the series of cleaning processes using the chemical solutions, a pure water rinsing process and a drying process are performed. However a description thereof is omitted for the avoidance of intricacy (the same holds true in the other portion). Examples of conditions for the aqueous ammonia/hydrogen peroxide solution process 52 that can be shown include 10 minute cleaning using an aqueous ammonia/hydrogen peroxide mixed solution (at a volume ratio of $NH_3:H_2O_2:H_2O=0.2:1:10$) at a temperature of 50° C. Examples of Conditions for the diluted hydrofluoric acid process 53 that can be shown include 10 minute cleaning using a diluted hydrofluoric acid (at a volume ratio of $HF:H_2O=1:500$) at a temperature of 80° C. Here, in the same manner as in the description given above, the hydrogen plasma process 71 may also be inserted between the processes 52 and 53.

Next, as shown in FIG. 23, the cleaning step 61 prior to the burying of the poly-silicon plug is performed. The reason for thus repeating the same cleaning step between a dry etching process and a CVD step or the like is that, during the transportation of the wafer 1 therebetween, contamination in an atmospheric air or a natural oxide film may be introduced thereinto. The cleaning step 61 prior to the burying of the poly-silicon plug can include, e.g., the aqueous ammonia/hydrogen peroxide solution process 62, a diluted hydrofluoric acid process 63 subsequent thereto, and the like. Examples of conditions for the aqueous ammonia/hydrogen peroxide solution process 62 that can be shown include 10 minute cleaning using an aqueous ammonia/hydrogen peroxide mixed solution (at a volume ratio of $NH_3:H_2O_2:H_2O=0.2:1:10$) at a temperature of 50° C. Examples of conditions for the diluted hydrofluoric acid process 63 that can be shown include 15 minute cleaning using a diluted hydrofluoric acid (at a volume ratio of $HF:H_2O=1:500$) at a temperature of 80° C. Here, in the same manner as in the description given above, the hydrogen plasma process 73 may also be inserted between the processes 62 and 63.

As shown in FIG. 23; instead of performing the diluted hydrofluoric acid process 63, it is also possible that, after cleaning is performed first using a chemical solution having a property of scraping a silicon member, the remaining silicon-oxide-based natural oxide film or the like may also be removed using a diluted-hydrofluoric-acid-based solution, as in the aqueous hydrofluoric acid/nitric acid solution process 62n and the aqueous hydrofluoric acid/nitric acid/ascetic acid solution process 62a. In this case, the process is performed at an ordinary temperature so that it is particularly suitable for single-wafer cleaning or the like. In the case of adding the hydrogen plasma process 73 described above to this nitric-acid-based cleaning, it is preferable to insert the hydrogen plasma process 73 between the nitric-acid-based solution process and the diluted-hydrofluoric-acid-based solution process in terms of completely removing the remaining oxide film.

As shown in FIG. 23, when the diluted hydrofluoric acid process 63, rinsing, and drying are completed, and the cleaning step 61 prior to the burying of the poly-silicon plug is thereby completed, the wafer 1 is transported toward a poly-silicon CVD device for a poly-silicon plug burying step 81. Note that the same hydrogen plasma process 74 as described above may also be performed immediately before the poly-silicon plug burying step 81.

The poly-silicon plug burying step 81 will be described in the subsequent section.

The structural features of the buried plug 7b formed through the foregoing cleaning step 61 prior to the burying of the poly-silicon plug will be described based on FIG. 25. As is obvious from FIG. 25, unlike in the case of FIG. 26, the entire surface area (except for the upper surface) of the buried plug 7b is covered with the solid-phase epitaxial region 36. This is because the solid-phase epitaxial process has progressed relatively equally not only in the epitaxial layer 1e, but also in the P⁺-type mono-crystalline silicon substrate layer is at a high boron concentration.

FIG. 19 schematically shows the result of the relatively equal progression of the solid-phase epitaxial process. That is, in the center portion of the buried plug 7b (silicon-based plug), there is the generally cylindrical poly-crystalline region 37, and the solid-phase epitaxial region 36 covers the entire peripheral area of the poly-crystalline region 37 except for the upper surface thereof. That is, the outside (periphery) of the poly-crystalline region 37 is covered with the solid-phase epitaxial region 36. In the state where the solid-phase epitaxial region 36 is thus formed relatively equally over the entire surface area of the buried plug 7b, an undesired stress does not occur around a boundary portion 6 so that a defect such as dislocation does not also occur from the portion.

In terms of preventing the occurrence of dislocation from around the boundary portion 6, the solid-phase epitaxial region 36 need not necessarily be formed relatively equally over the entire surface area of the buried plug 7b. It follows that, as shown in FIG. 20, it is sufficient for the solid-phase epitaxial region 36 formed in the surface of the portion of the buried plug 7b closer to the epitaxial layer 1e to extend by a given distance into the silicon substrate layer 1s. It will be appreciated that the buried plug 7b may also be formed only of the solid-phase epitaxial region 36. Here, in the solid-phase epitaxial region 36 formed in the surface of the portion of the buried plug 7b closer to the epitaxial layer 1e, the boron concentration of the epitaxial layer 1e is low so that the solid-phase epitaxial region 36 is formed relatively equally irrespective of cleaning conditions.

From this, it will be understood that, in terms only of preventing the occurrence of an undesired stress around the boundary portion 6, it is sufficient if the solid-phase epitaxial region 36 is formed to have a given width (the length Le of the portion of the solid-phase epitaxial layer extending upwardly from the boundary and the length Ls of the portion of the solid-phase epitaxial layer extending downwardly from the boundary) above and below the boundary 6 between the epitaxial layer 1e and the silicon substrate layer 1s, as shown in FIG. 21 and FIG. 22 corresponding to a cross section along the line Z-Z' of FIG. 21.

Specifically, if each of the length Le of the portion of the solid-phase epitaxial layer extending upwardly from the boundary and the length Ls of the portion of the solid-phase epitaxial layer extending downwardly from the boundary is 200 nm or more, it can be considered that the localization of a stress is avoidable.

That is, as shown in FIGS. 21 and 22, in terms only of preventing the occurrence of an undesired stress in the vicinity of the boundary portion 6, it is sufficient if the solid-phase epitaxial region 36 is formed so as to have a given width above and below the boundary portion 6 between the epitaxial layer 1e and the silicon substrate layer 1s, and cover the periphery of the poly-crystalline region 37 including the region of the boundary portion 6.

2. Description of Principal-Portion Structure of Semiconductor Device of Embodiment of Present Invention and Device-Principal-Portion Cross-Sectional Process Flow in Manufacturing Method thereof, etc. (Principally from FIGS. 1 to 18).

FIGS. 2 to 18 are device-process cross-sectional flow diagrams (from the time when the epitaxial wafer is received till the time when the wafer process is completed) associated with the method of manufacturing the semiconductor device according to the embodiment of the present invention. FIG. 1 is a schematic plan view of the LDMOSFET portion (at the time when a gate electrode structure is completed) in the semiconductor device according to the embodiment of the present invention, which corresponds to FIG. 17. Based on these drawings, a description will be given of a principal-portion structure of the semiconductor device according to the embodiment of the present invention and a device-principal-portion cross-sectional process flow in the manufacturing method thereof and so forth.

Figure 2:
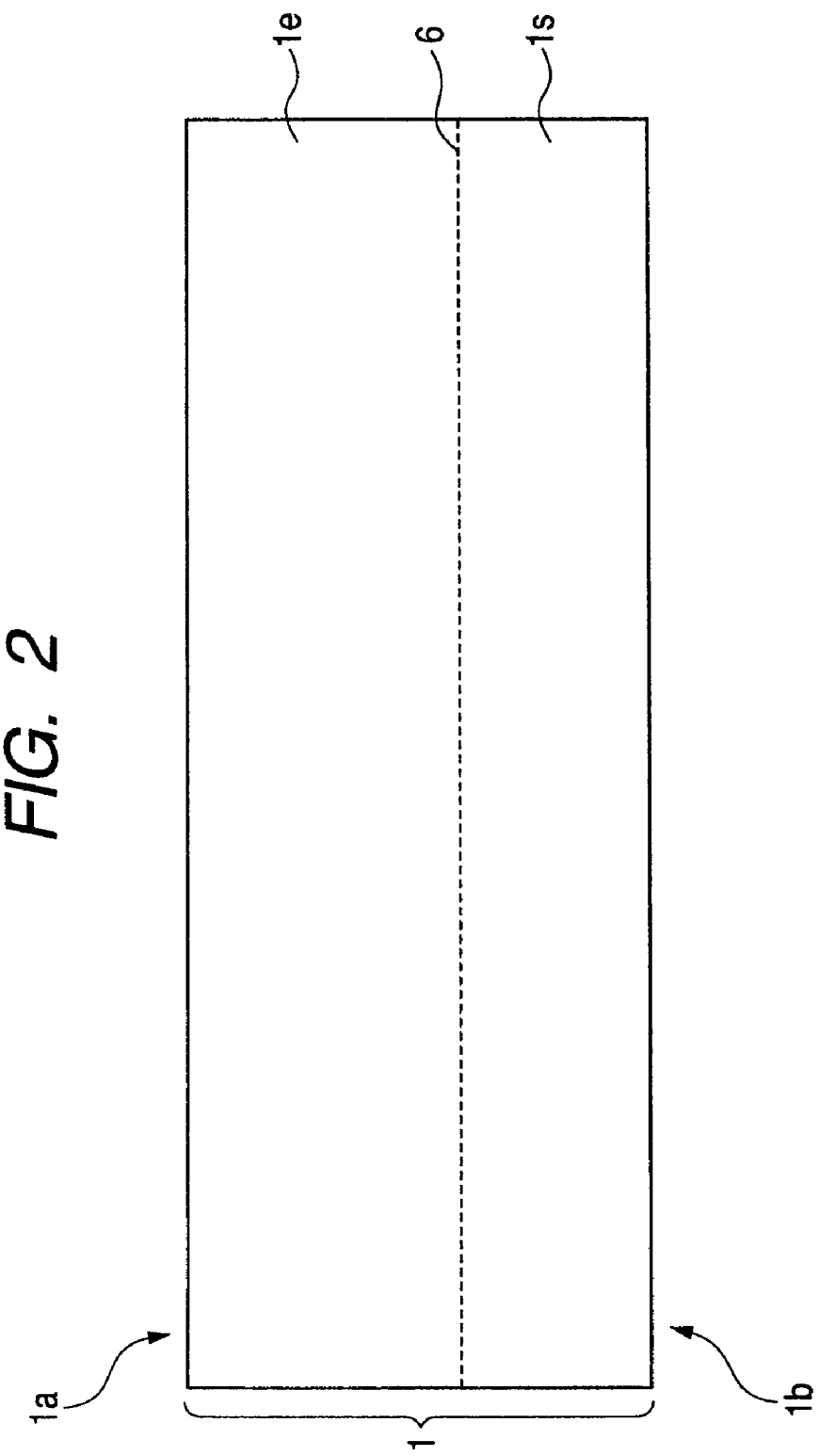
FIG. 2 is a device-process cross-sectional flow diagram (at the time when an epitaxial wafer is received) associated with a method of manufacturing the semiconductor device according to the embodiment of the present invention.

As shown in FIG. 2, a 200-ϕ P-type mono-crystalline silicon wafer 1 (silicon-based mono-crystalline semiconductor substrate), e.g., is prepared (which may be a 300-ϕ wafer or a 450-ϕ wafer as necessary, or otherwise a wafer which is not an epitaxial wafer, or otherwise an N-type wafer as necessary). The epitaxial wafer 1 includes the lower P⁺-type mono-crystalline silicon substrate layer is (i.e., a "first semiconductor layer" having a thickness of, e.g., about 700 micrometers, and covering a range of, e.g., 500 to 1000 micrometers), the P-type epitaxial layer 1e (i.e., a "second semiconductor layer" having a thickness of, e.g., about 2 micrometers, and covering a range of, e.g., 1 to 20 micrometers) of the P-type wafer over the first main surface 1a thereof (main surface opposite to a back surface 1b), and the like. Here, the silicon substrate layer 1s and the epitaxial layer 1e abut each other across the boundary 6. Examples of the impurity concentration (boron concentration) of the silicon substrate layer is that can be shown include $5.7 \times 10^{19}/cm^3$ (first impurity concentration). On the other hand, examples of the impurity concentration (boron concentration) of the epitaxial layer 1e that can be shown include $6.7 \times 10^{14}/cm^3$ (second impurity concentration). In order to reduce the ON resistance, the impurity concentration of the silicon substrate layer is required to be as high as possible, while the impurity concentration of the epitaxial layer 1e is required to be relatively low in terms of ensuring the characteristics of the channel portion, voltage resistance, and the like. Accordingly, the impurity concentration of the silicon substrate layer is normally higher than the impurity concentration of the epitaxial layer 1e, specifically 1000 times or more (preferably 10000 times or more) higher than the impurity concentration of the epitaxial layer 1e. Note that the boron concentration of the buried plug 7b is normally higher than the impurity concentration of the silicon substrate layer 1s, and typically about $7 \times 10^{20}/cm^3$.

Figure 3:
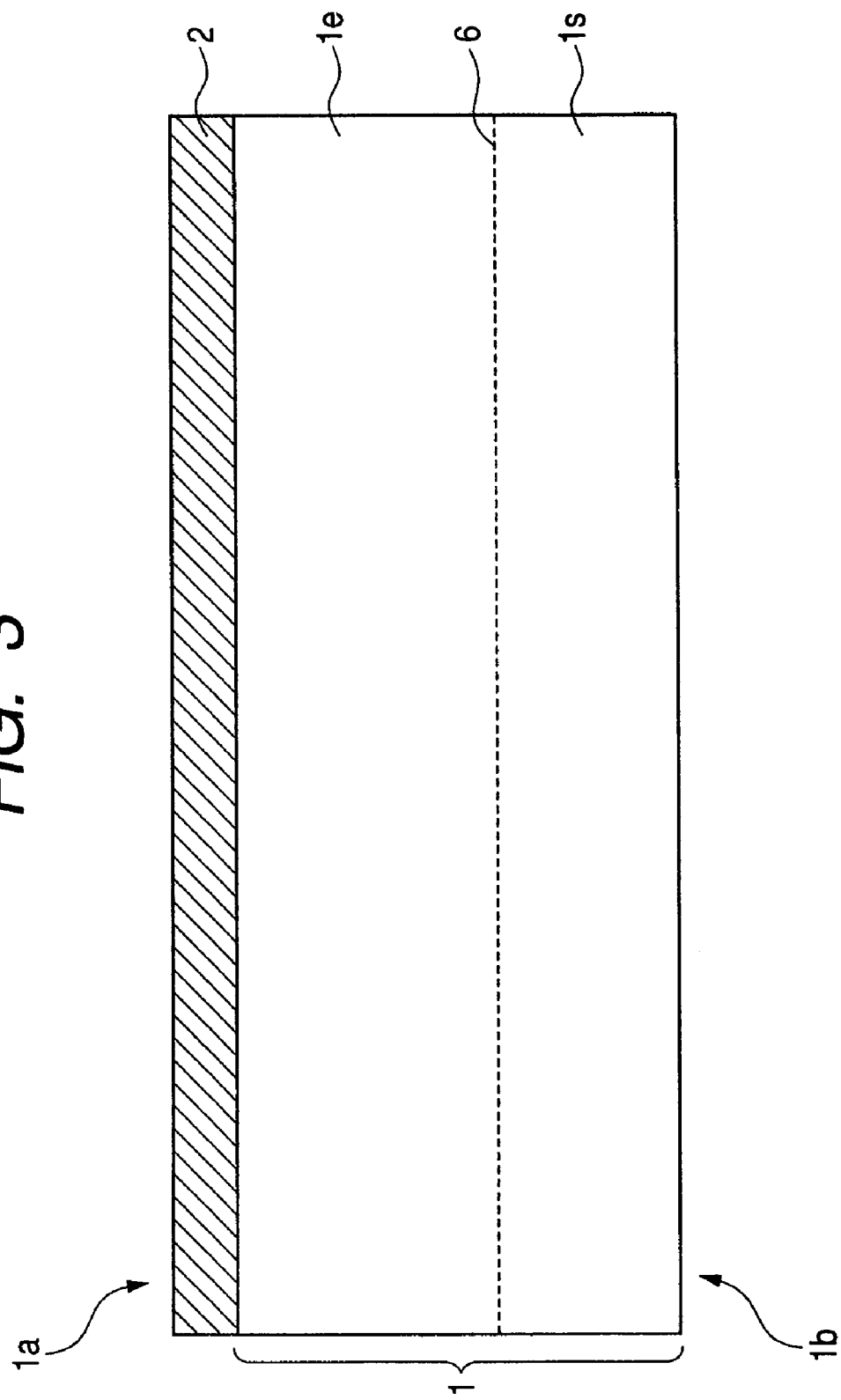
FIG. 3 is a device-process cross-sectional flow diagram (at the time when a hard mask film for forming a buried plug hole is formed) associated with the method of manufacturing the semiconductor device according to the embodiment of the present invention.

Next, as shown in FIG. 3, a hard mask film 2 for forming the buried plug hole is formed. Examples of the hard mask film that can be shown include a Tetra-Ethyl-Ortho-Silicate (TEOS) $SiO^2$ having a thickness of about 150 nm that is formed by a thermal Chemical Vapor Deposition (CVD) method (the process temperature is, e.g., about 680° C.).

Figure 4:
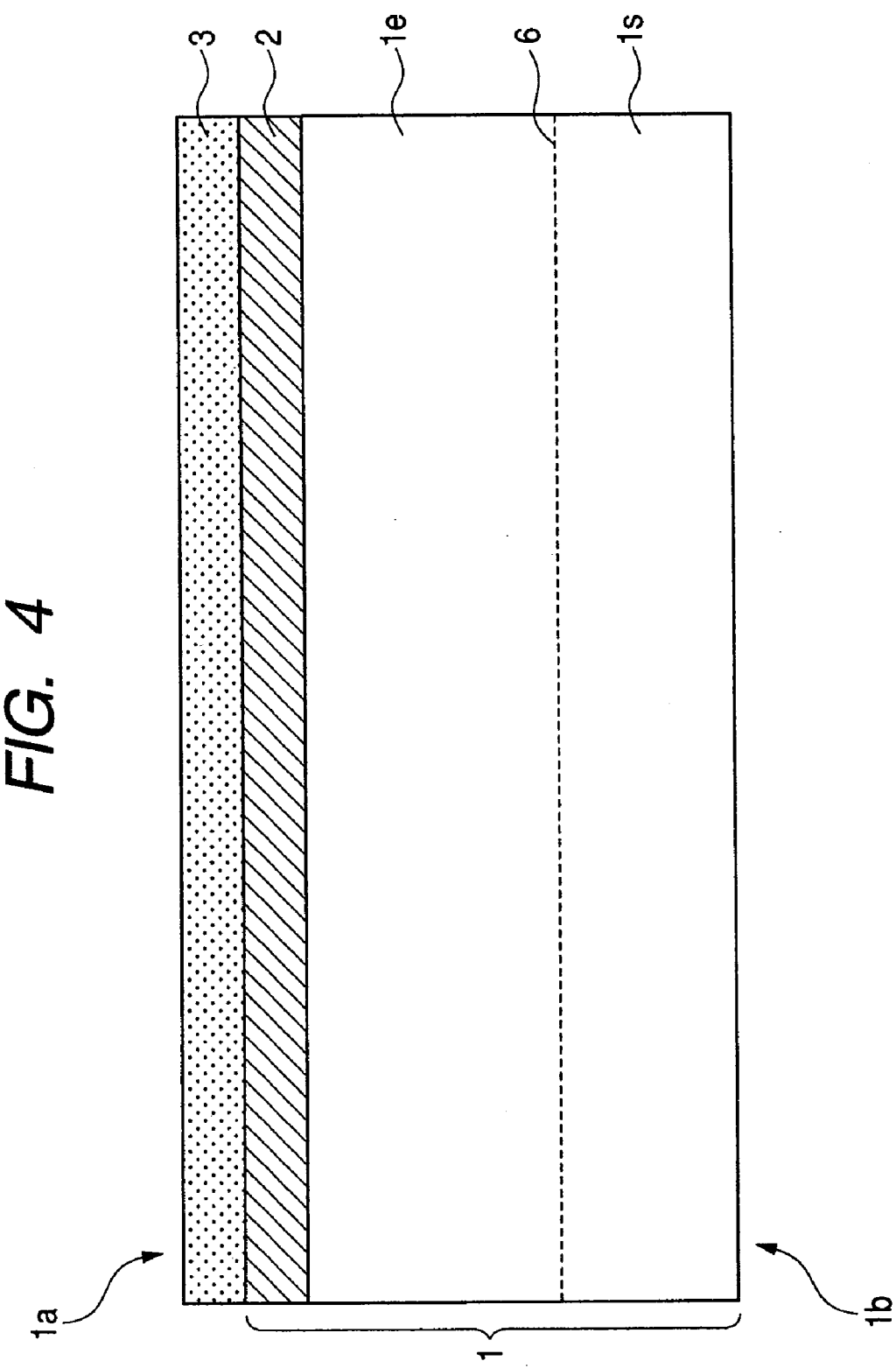
FIG. 4 is a device-process cross-sectional flow diagram (at the time when a resist film for forming the buried plug hole is formed) associated with the method of manufacturing the semiconductor device according to the embodiment of the present invention.

Next, as shown in FIG. 4, substantially the entire surface of the wafer 1 is coated with a resist film 3 for forming the buried plug hole.

Figure 5:
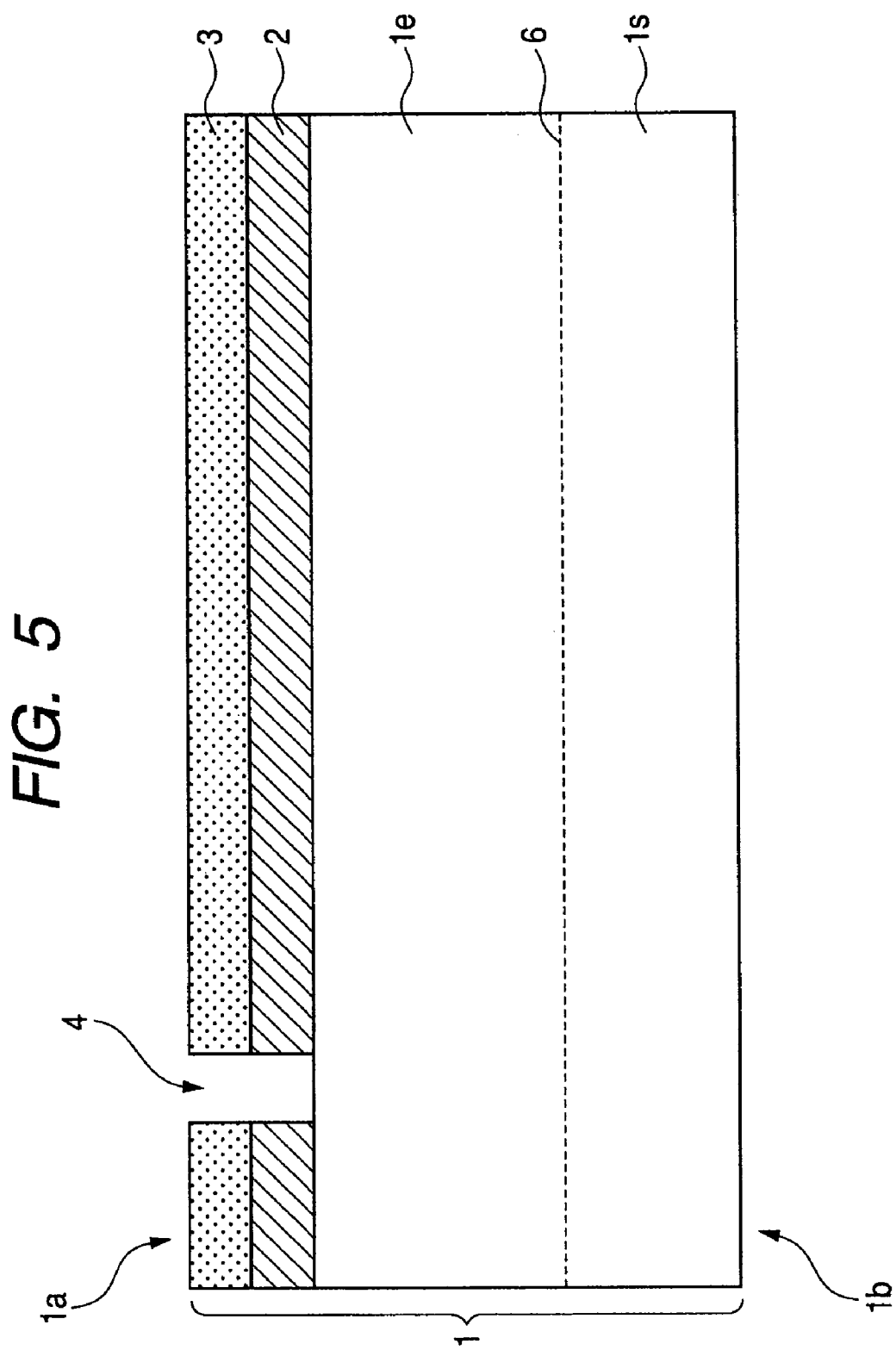
FIG. 5 is a device-process cross-sectional flow diagram (at the time when the hard mask film for forming the buried plug hole is patterned) associated with the method of manufacturing the semiconductor device according to the embodiment of the present invention.

Next, as shown in FIG. 5, an opening 4 for forming the buried plug hole is bored in the resist film 3 by typical lithography. Subsequently, the opening 4 is extended to the hard mask film 2 by dry etching (examples of an etching gas atmosphere that can be shown include a fluorocarbon gas/$O_2$ type) using the resist film 3 as an etching resistant mask. Here, the resist film 3 that is no more needed is removed.

Figure 6:
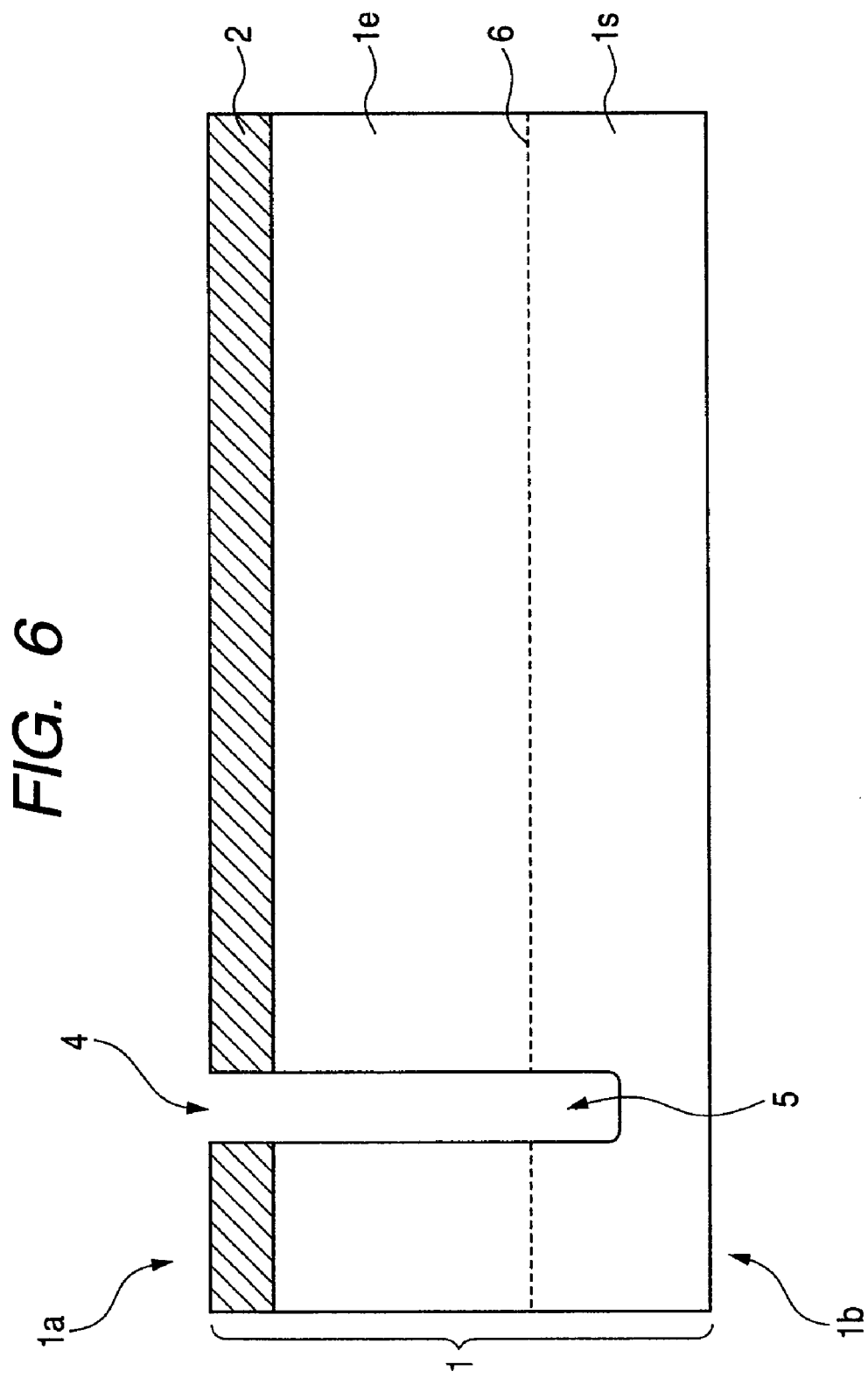
FIG. 6 is a device-process cross-sectional flow diagram (at the time when the buried plug hole is formed) associated with the method of manufacturing the semiconductor device according to the embodiment of the present invention.

Next, as shown in FIG. 6, the buried plug hole 5 (the depth thereof is about 2.7 micrometers on the assumption that the thickness of the epitaxial layer 1e is 2 micrometers) is formed in the portion of the device surface 1a of the wafer 1 corresponding to the opening 4 to extend through the epitaxial layer 1e, and reach the inside of the silicon substrate layer is by dry etching (examples of an etching gas atmosphere that can be shown include a $Cl_2/HBr/He/O_2$ type) using the hard mask film 2 as an etching resistant mask.

Next, as shown in FIG. 23, the cleaning step 51 after the formation of the buried plug hole is performed. Subsequently, the cleaning step 61 prior to the burying of the poly-silicon plug is performed. As shown in FIG. 23, details of these steps are as described in Section 1.

Figure 7:
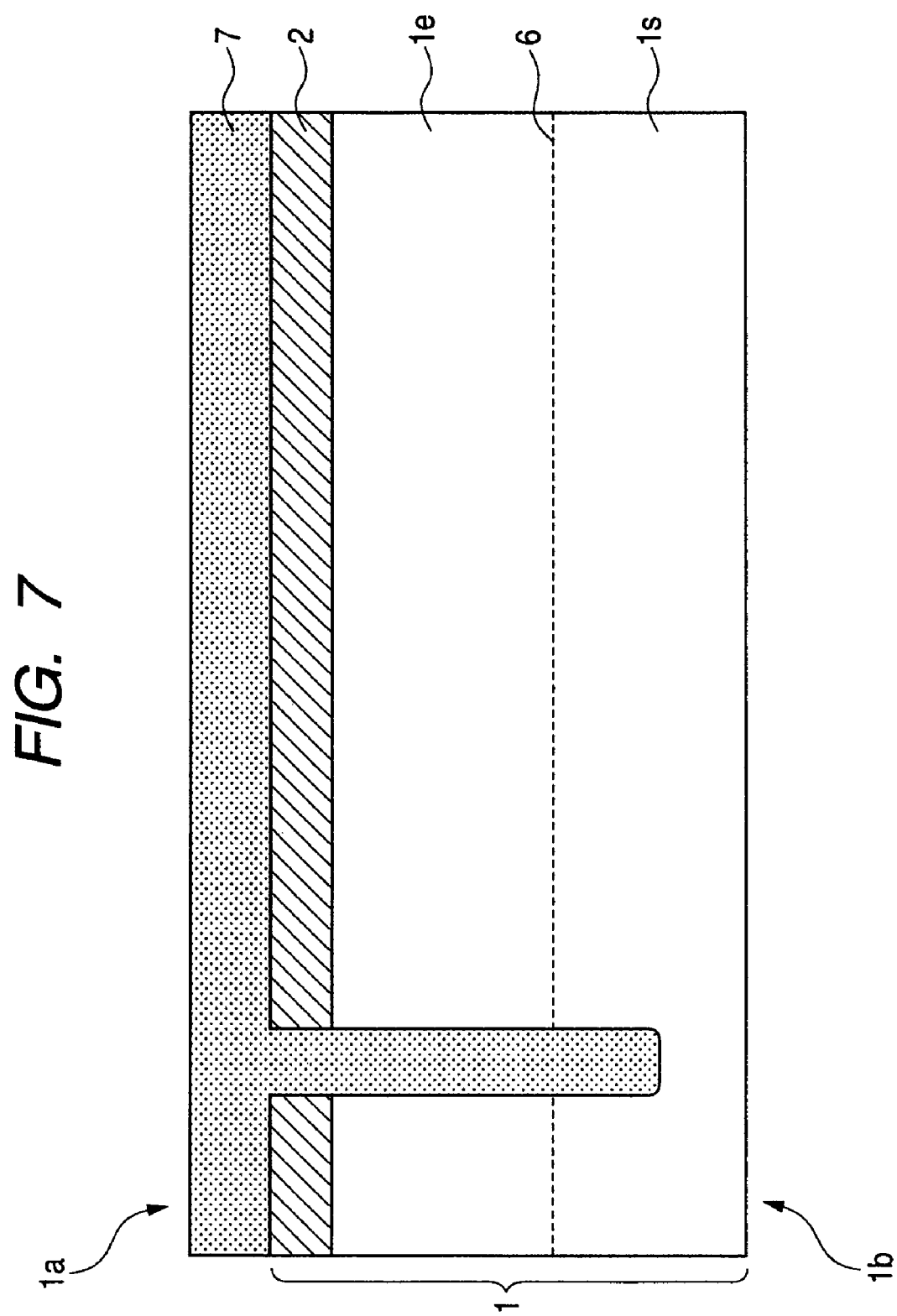
FIG. 7 is a device-process cross-sectional flow diagram (at the time when a plug is buried) associated with the method of manufacturing the semiconductor device according to the embodiment of the present invention.

Next, as shown in FIG. 7, by performing a poly-silicon CVD step for burying the poly-silicon plug, a poly-silicon film 7 is formed in the buried plug hole 5 and over substantially the entire device surface 1a of the wafer 1. This step can be performed at, e.g., the following two stages. That is, a boron-doped poly-silicon film is formed (the process temperature is, e.g., about 400° C., and the film thickness is, e.g., about 400 nm). Subsequently, a non-doped poly-silicon film is formed (the process temperature is, e.g., about 530° C., and the film thickness is, e.g., about 100 nm).

Figure 8:
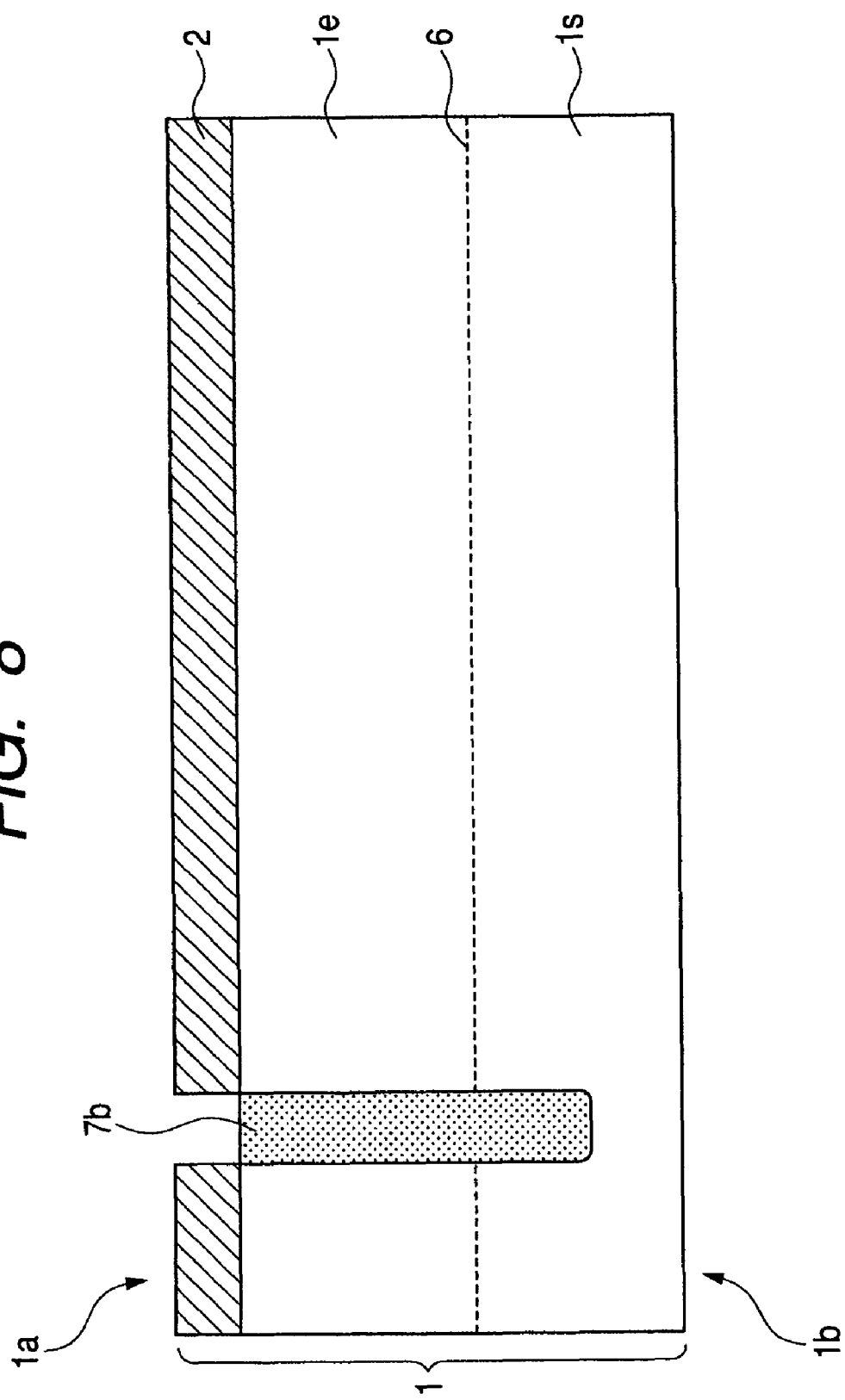
FIG. 8 is a device-process cross-sectional flow diagram (at the time of etch-back) associated with the method of manufacturing the semiconductor device according to the embodiment of the present invention.

Next, as shown in FIG. 8, the poly-silicon film 7 is etched back (an amount of etching corresponds to about 500 nm) by dry etching (the etching gas is, e.g., $SF_6$ and the stage temperature is, e.g., about 5° C.). In this manner, the buried plug 7b is formed.

Figure 9:
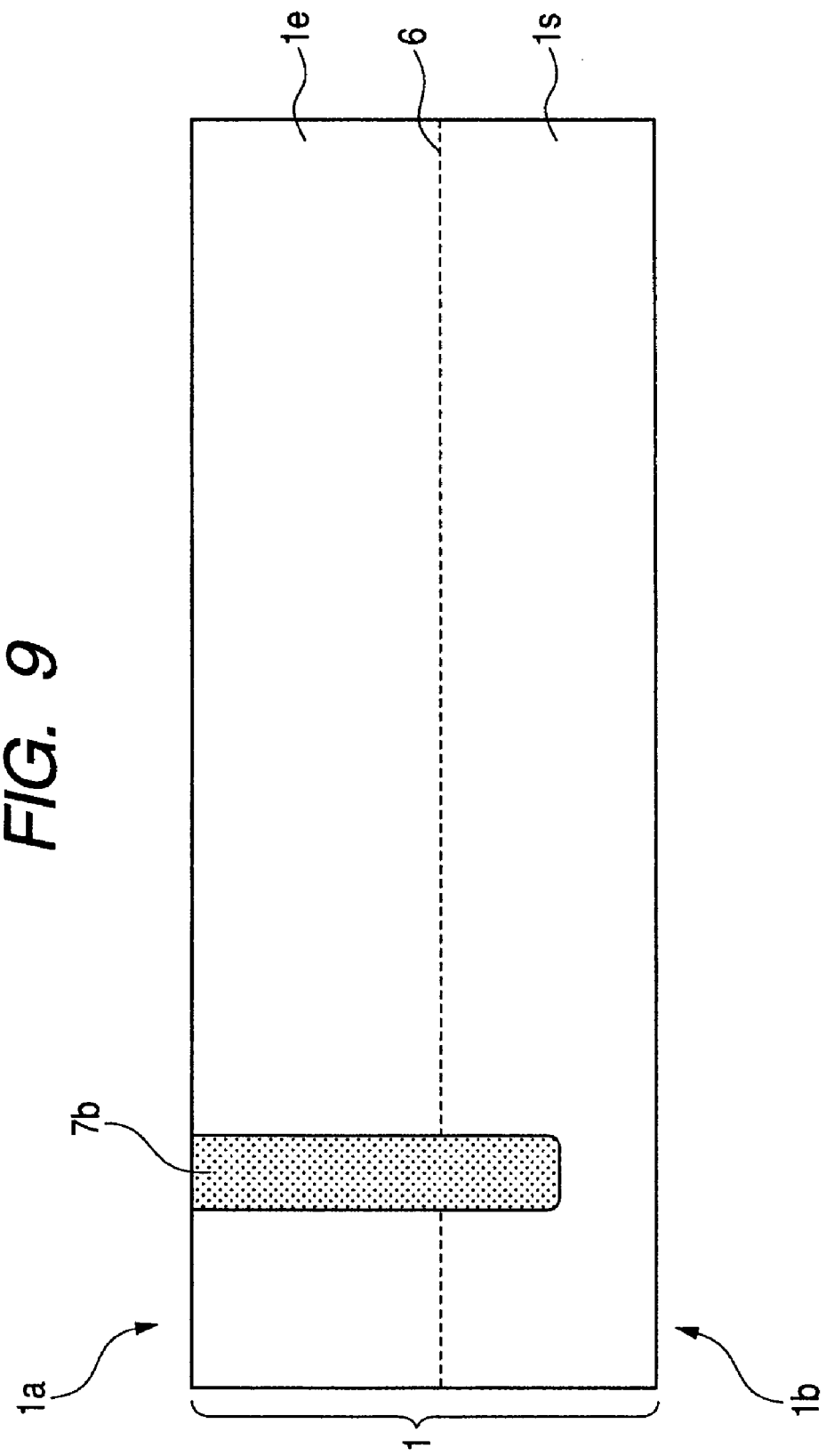
FIG. 9 is a device-process cross-sectional flow diagram (at the time when the hard mask film for forming the buried plug hole is removed) associated with the method of manufacturing the semiconductor device according to the embodiment of the present invention.

Next, as shown in FIG. 9, cleaning prior to surface oxidation is performed, thereby removing the hard mask film 2 for forming the buried plug hole. Here, the cleaning prior to surface oxidation can include an aqueous ammonia/hydrogen peroxide solution process, a diluted hydrofluoric acid process subsequent thereto, and the like. Examples of conditions for the aqueous ammonia/hydrogen peroxide solution process that can be shown include 15 minute cleaning using an aqueous ammonia/hydrogen peroxide mixed solution (at a volume ratio of $NH_3:H_2O_2:H_2O=0.2:1:10$) at a temperature of 50° C. Examples of conditions for the diluted hydrofluoric acid process include 7.5 minute cleaning using a diluted hydrofluoric acid (at a volume ratio of $HF:H_2O=1:19$) at an ordinary temperature.

Figure 10:
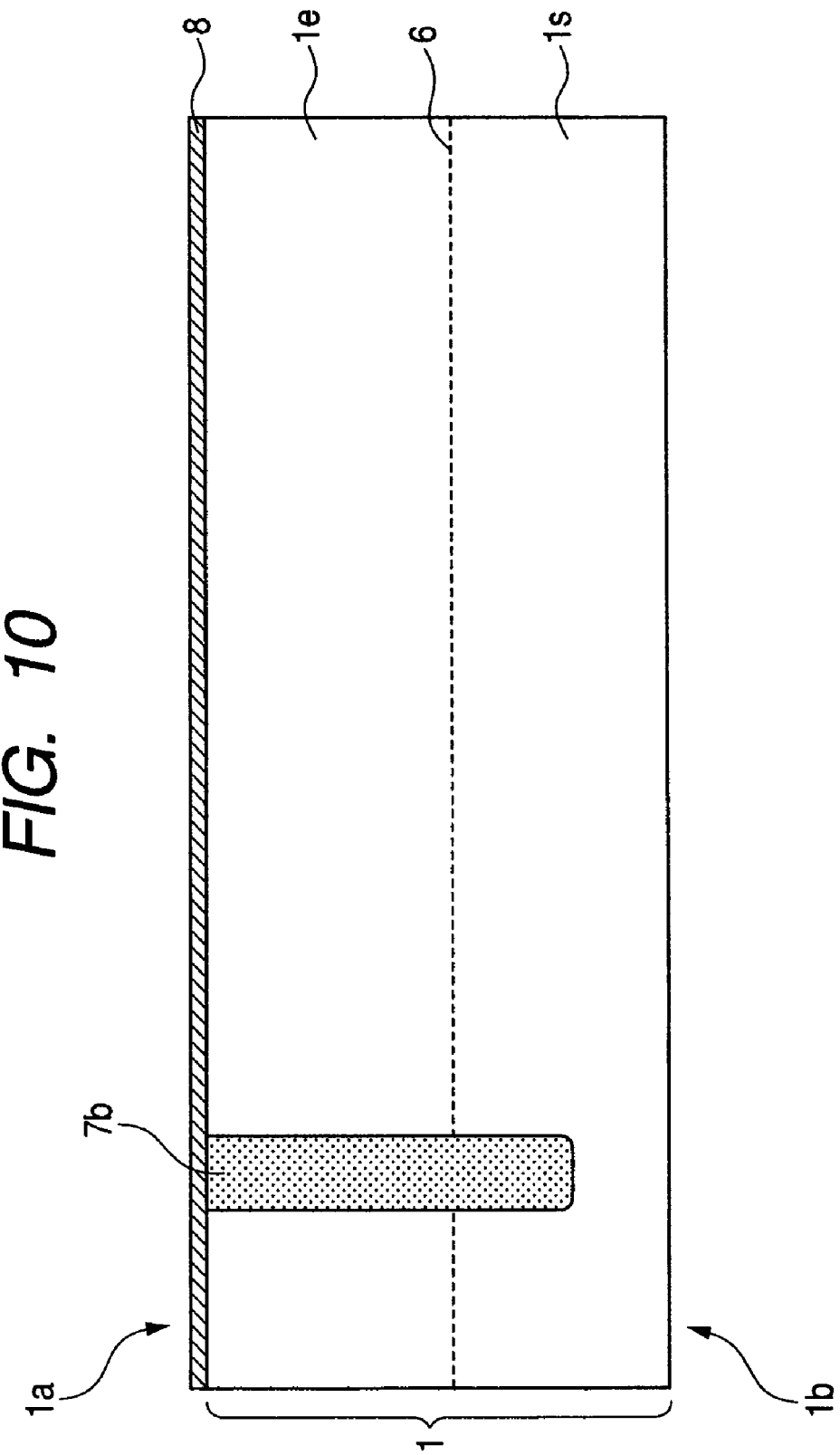
FIG. 10 is a device-process cross-sectional flow diagram (at the time when a liner silicon oxide film for STI formation is formed) associated with the method of manufacturing the semiconductor device according to the embodiment of the present invention.

Next, as shown in FIG. 10, surface oxidation is performed by thermal oxidation to form a pad silicon oxide film 8 for forming a Shallow Trench Isolation (STI). Examples of conditions for the oxidation that can be shown include an oxidation temperature of about 800° C., a wet atmosphere, a process time of 10 minutes, and a film thickness of about 10 nm.

Figure 11:
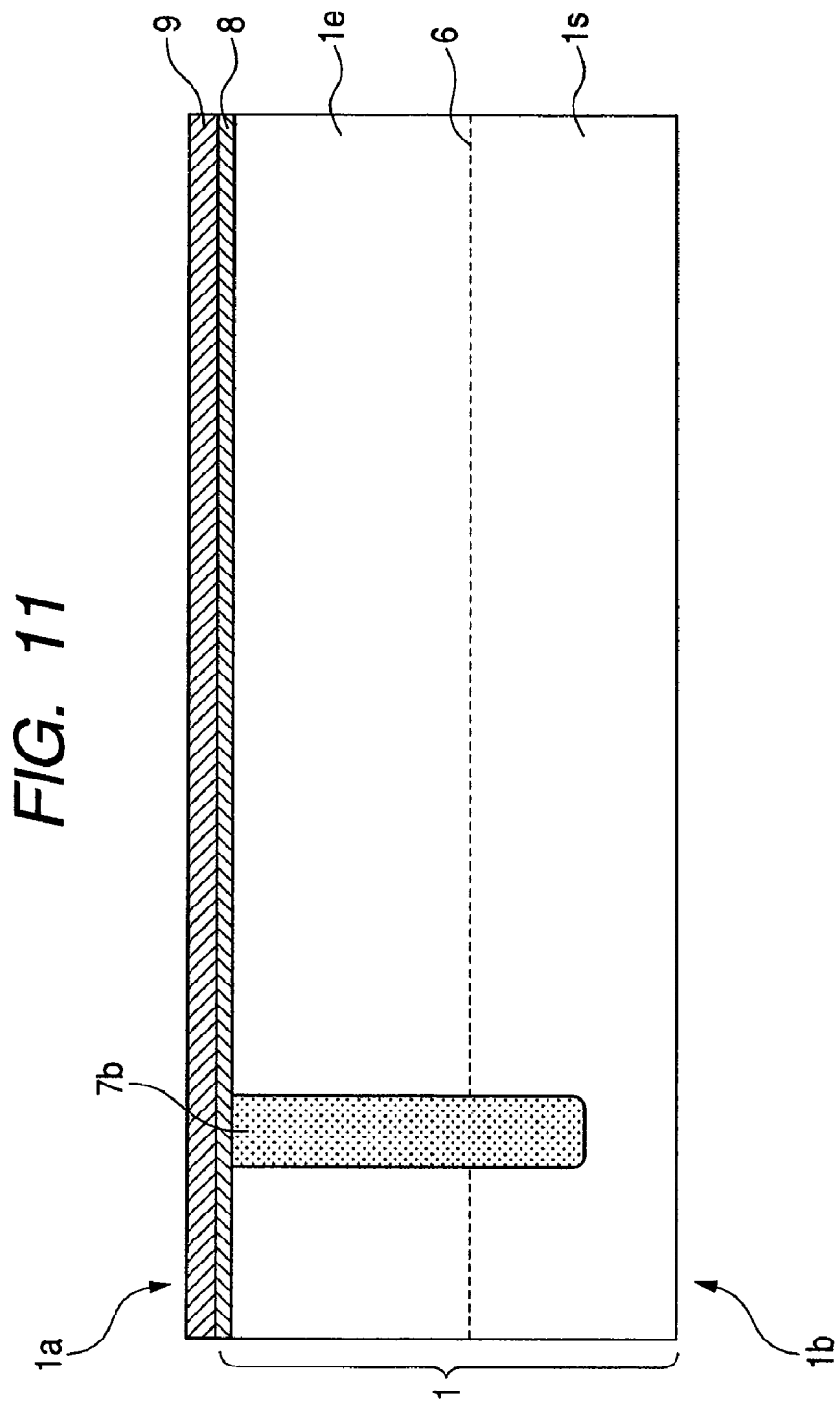
FIG. 11 is a device-process cross-sectional flow diagram (at the time when a silicon nitride film for STI formation is formed) associated with the method of manufacturing the semiconductor device according to the embodiment of the present invention.

Next, as shown in FIG. 11, an STI silicon nitride film 9 is formed by CVD over the pad silicon oxide film 8 (the process temperature is about 780° C., and the film thickness is about 120 nm).

Figure 12:
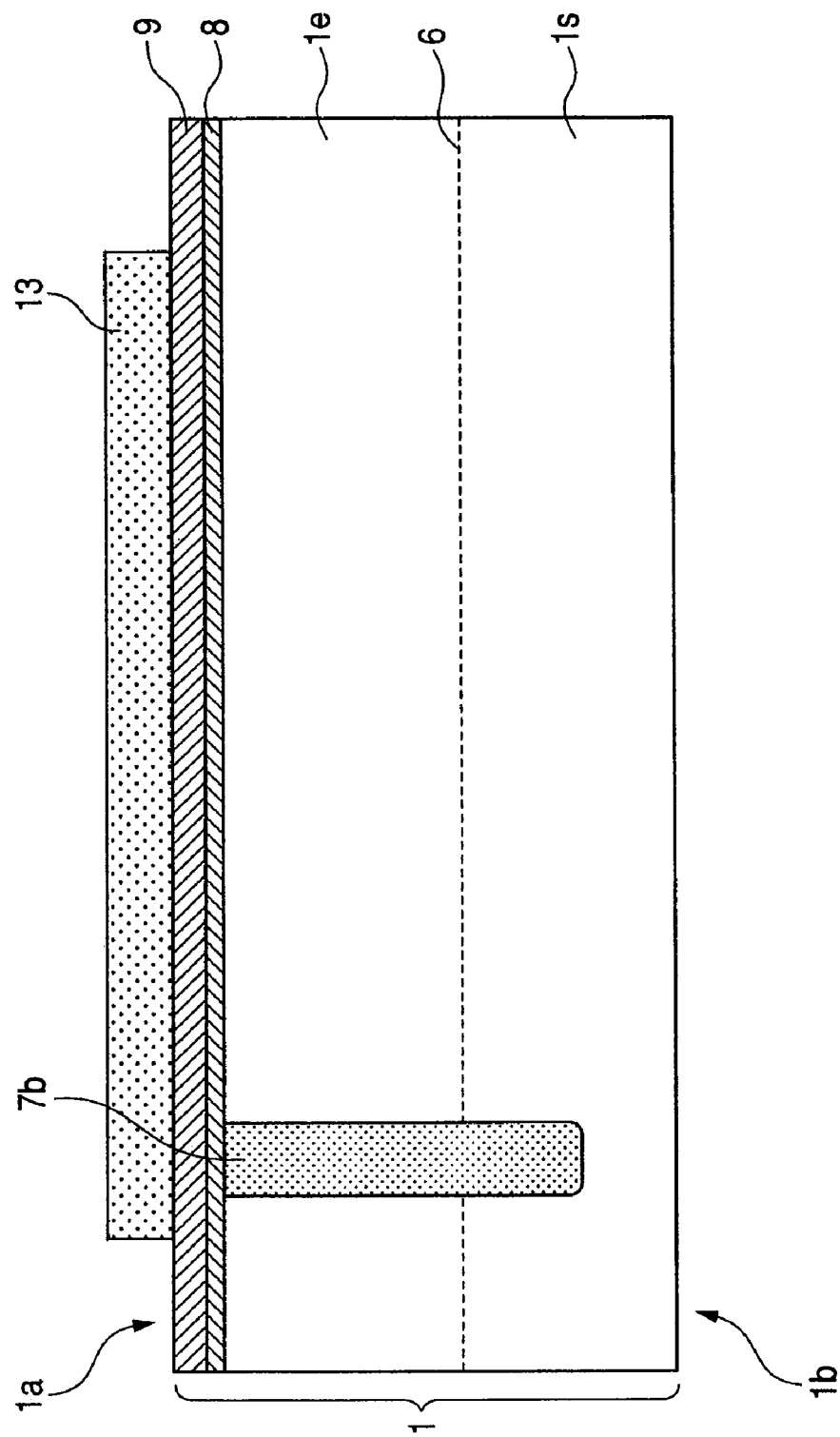
FIG. 12 is a device-process cross-sectional flow diagram (at the time when a resist film for STI formation is formed) associated with the method of manufacturing the semiconductor device according to the embodiment of the present invention.
Figure 13:
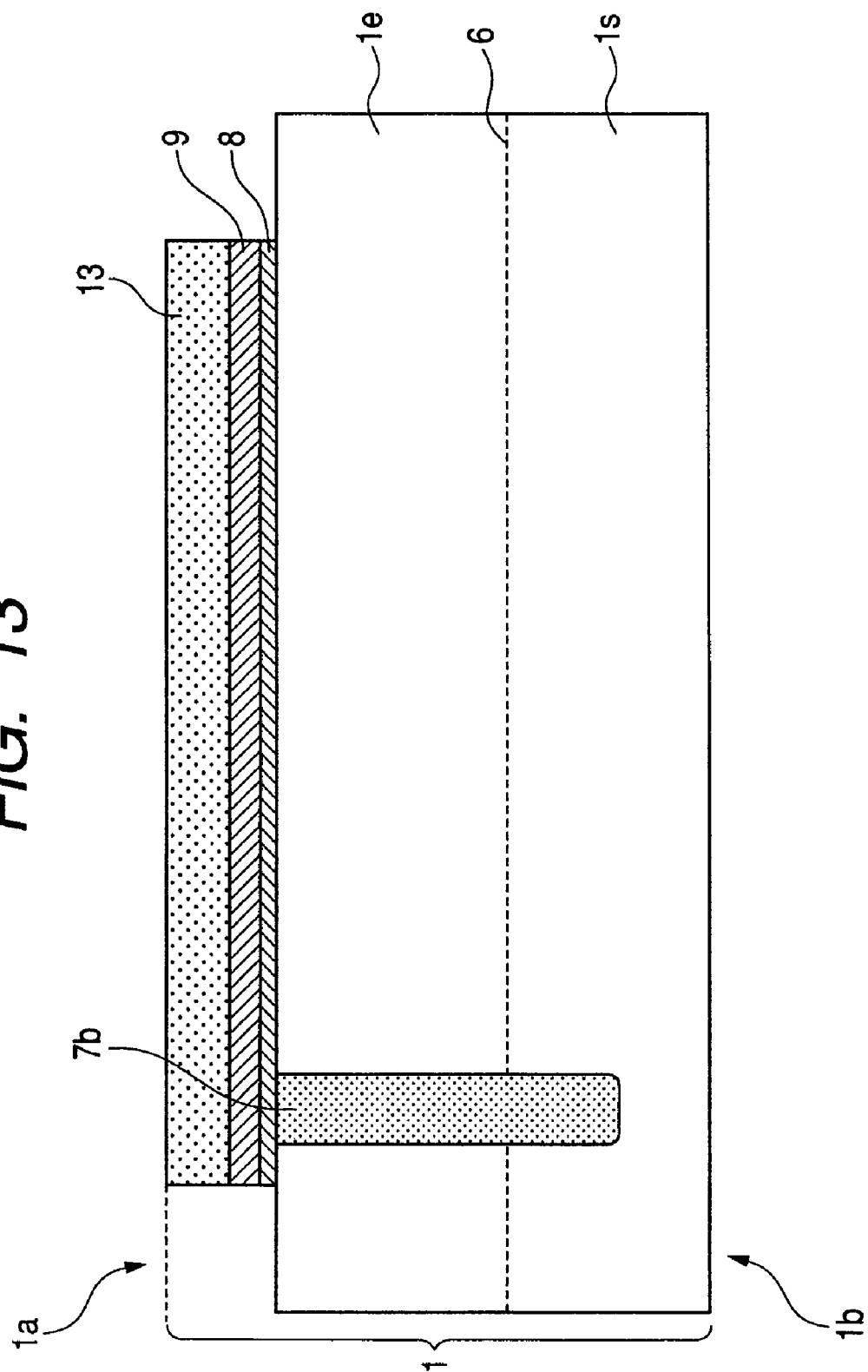
FIG. 13 is a device-process cross-sectional flow diagram (at the time when the silicon nitride film for STI formation is patterned) associated with the method of manufacturing the semiconductor device according to the embodiment of the present invention.

Next, as shown in FIG. 12, a resist film 13 for STI formation is patterned by typical lithography. Subsequently, as shown in FIG. 13, the underlying pad silicon oxide film 8 and the silicon nitride film 9 are simultaneously patterned using the resist film 13 as a mask.

Figure 14:
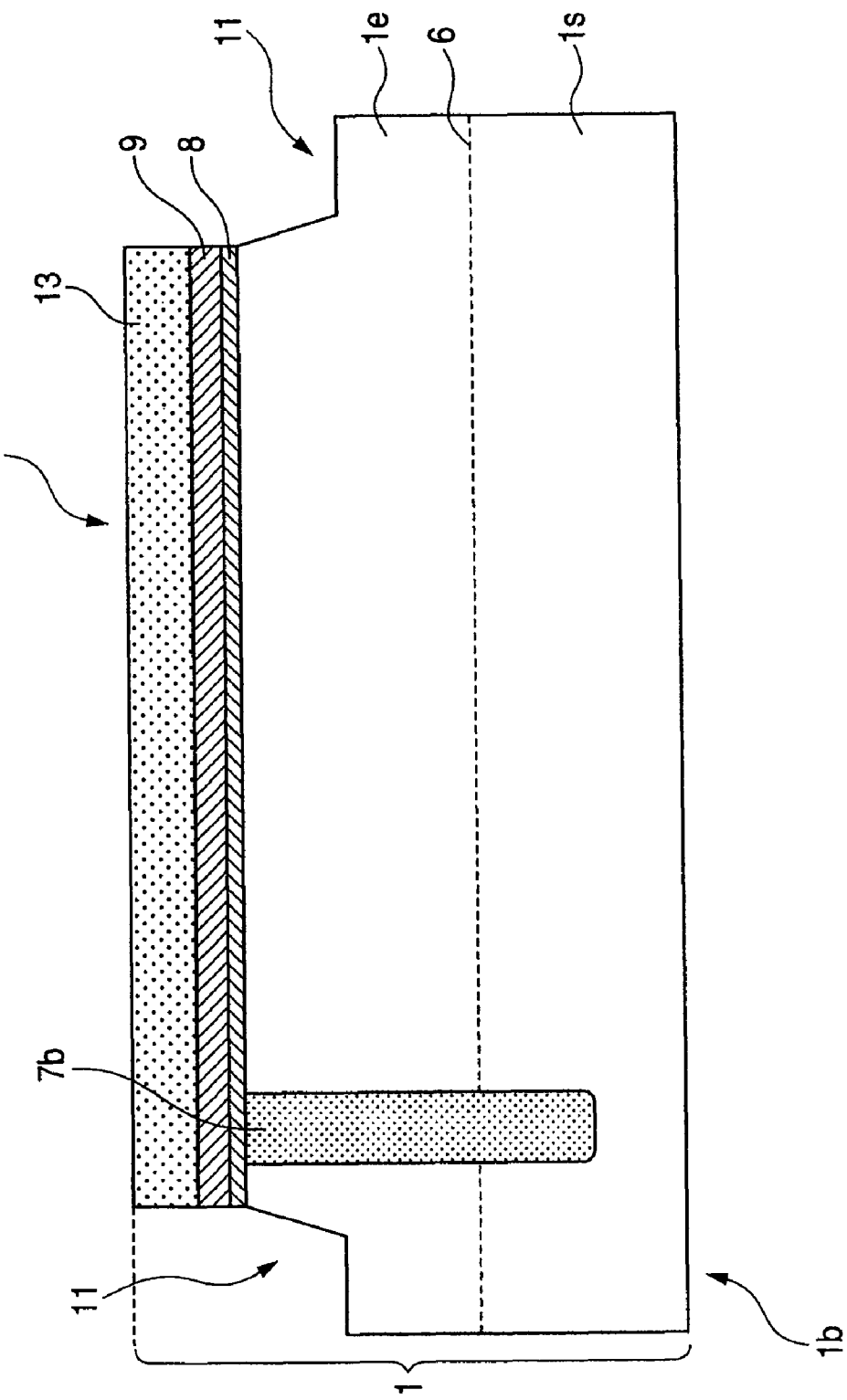
FIG. 14 is a device-process cross-sectional flow diagram (at the time when a trench for STI formation is formed) associated with the method of manufacturing the semiconductor device according to the embodiment of the present invention.

Next, as shown in FIG. 14, in a state where there are the resist film 13, the pad silicon oxide film 8, and the silicon nitride film 9, STI trenches 11 (each having a depth of, e.g., about 385 nm) is formed in the epitaxial layer 1e by dry etching. Here, the resist film 13 for STI formation that is no more needed is removed.

Figure 15:
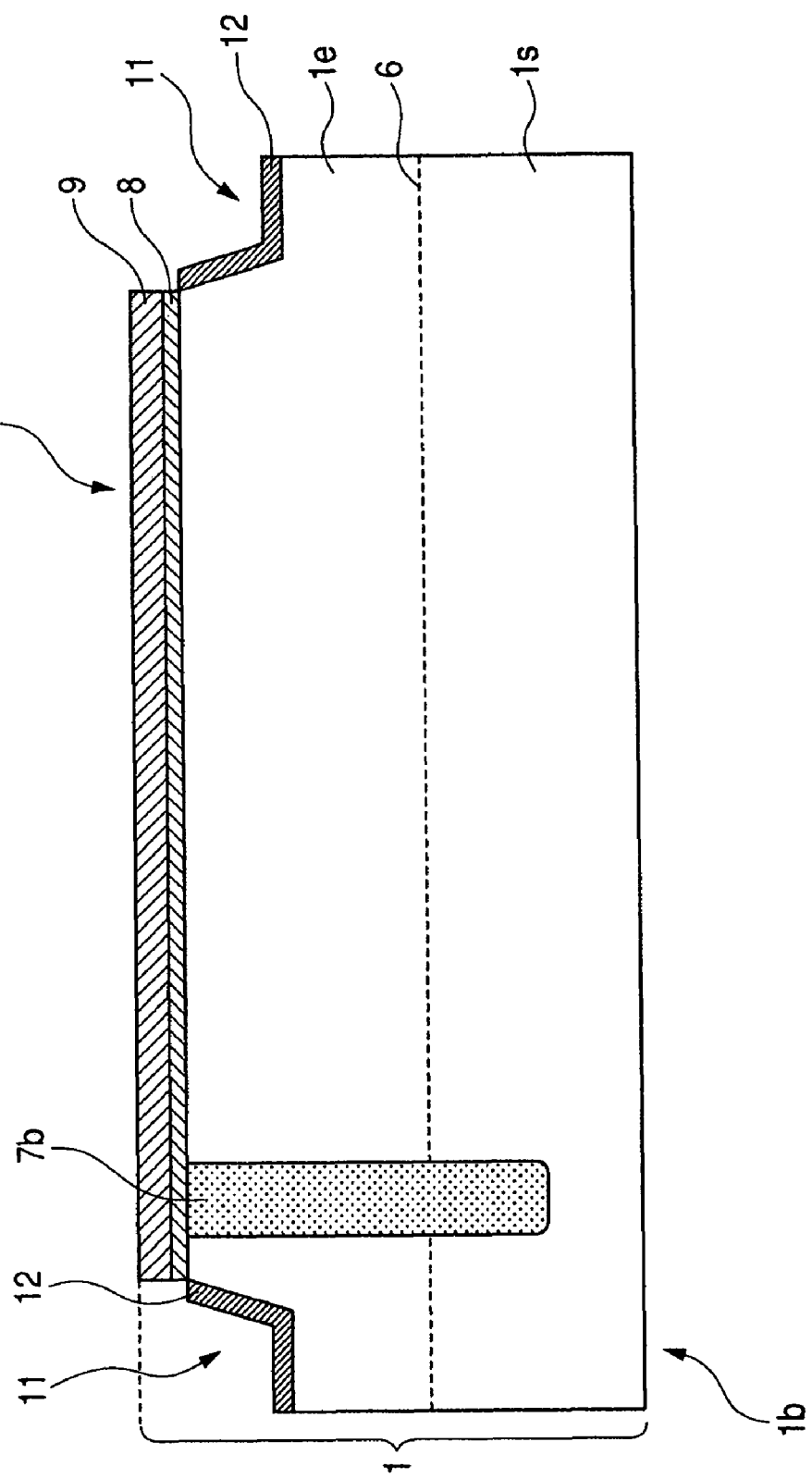
FIG. 15 is a device-process cross-sectional flow diagram (at the time when the inner surface of the trench for STI formation is oxidized) associated with the method of manufacturing the semiconductor device according to the embodiment of the present invention.

Next, as shown in FIG. 15, STI liner oxidation is performed to form an STI liner silicon oxide film 12 (the process temperature is about 1000° C., the process time is about 27 minutes, and the film thickness is about 30 nm) in each of the STI trenches 11 by thermal oxidation. Note that, by the thermal process at a temperature of 800° C. or more, the solid-phase epitaxial region 36 of the buried plug 7b is mainly formed (in an amorphous or a poly-crystalline silicon state at the initial stage of burying). Subsequently, a silicon oxide film to be buried is formed over substantially the entire device surface 1a of the wafer 1. Examples of the silicon oxide film that can be shown include a silicon oxide film having a thickness of about 370 nm that is formed by High Density Plasma-Chemical Vapor Deposition (HDP-CVD) using a gas atmosphere containing, e.g., monosilane, argon, oxygen, and the like.

Figure 16:
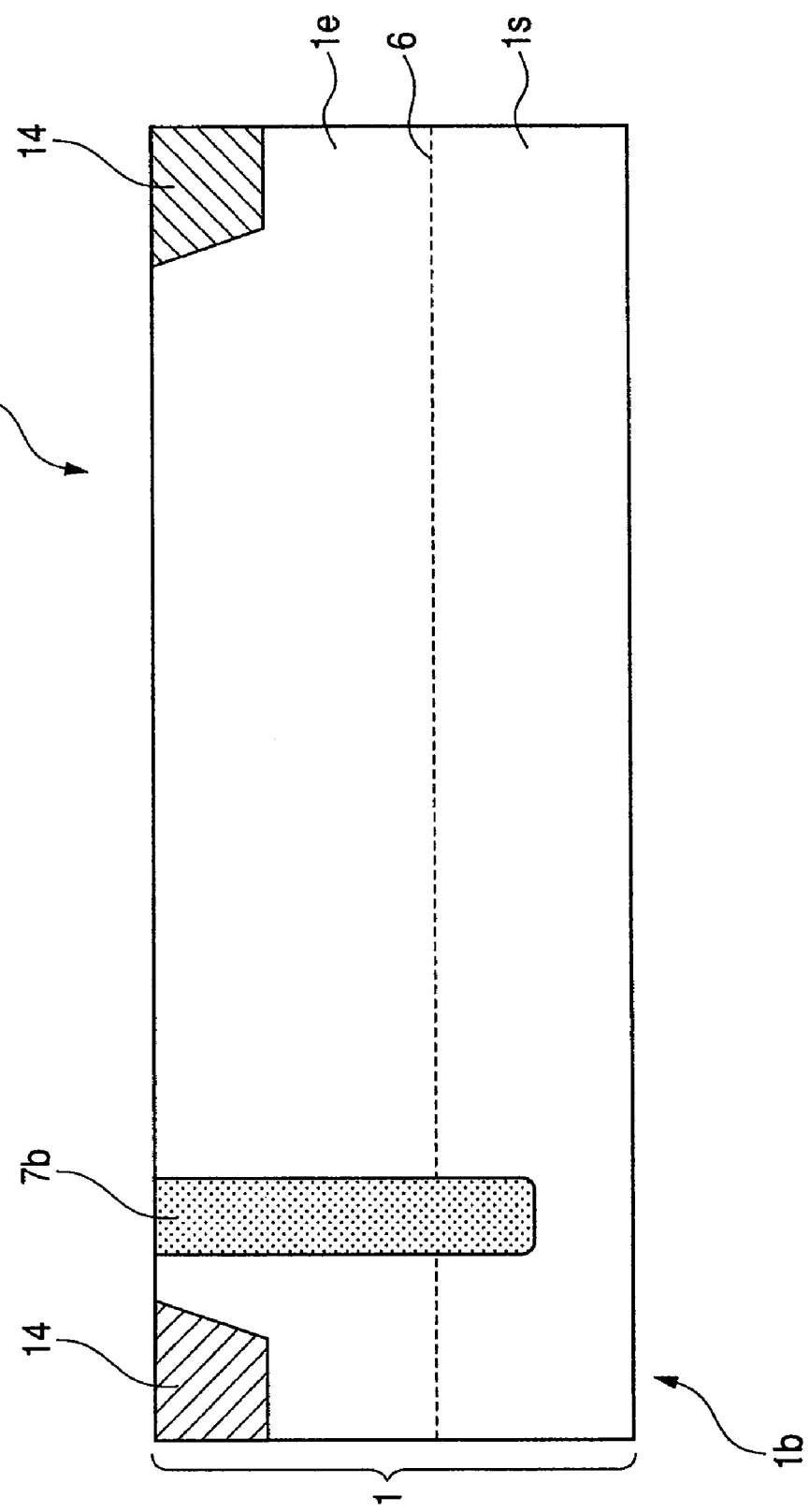
FIG. 16 is a device-process cross-sectional flow diagram (at the time when an STI structure is completed) associated with the method of manufacturing the semiconductor device according to the embodiment of the present invention.

Next, as shown in FIG. 16, the unneeded silicon oxide film, the unneeded pad silicon oxide film 8, and the unneeded silicon nitride film 9 are removed by Chemical Mechanical Planarization (CMP) or the like so that an insulating film 14 for burying the STI remains in each of the STI trenches 11.

Figure 17:
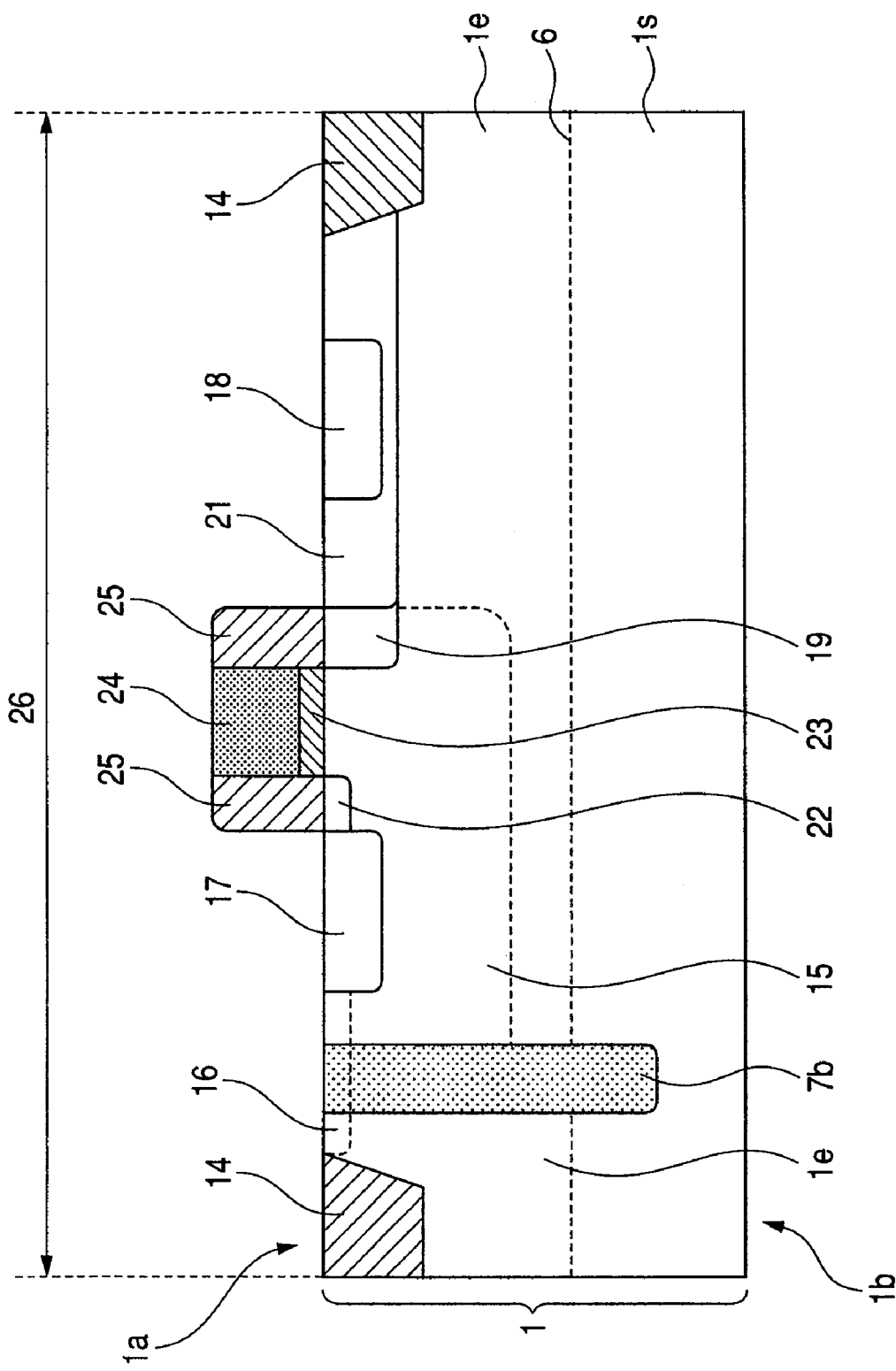
FIG. 17 is a device-process cross-sectional flow diagram (at the time when a gate electrode structure is completed) associated with the method of manufacturing the semiconductor device according to the embodiment of the present invention.

Subsequently, as shown in FIGS. 1 and 17 (a cross section along the line X-X' of FIG. 1), main diffusion regions (impurity doped regions) forming an LDMOSFET 26, a gate electrode structure (including a gate insulating film 23, a gate electrode 24 of poly-silicon, polycide, or the like formed thereover, sidewall spacer insulating films 25 formed on both sides thereof, and the like), and the like are successively formed. Within the P-type epitaxial layer 1e under the gate insulating film 23, formed is a P-type well region 15 (punch-through stopper). In the surface area of the P-type epitaxial layer 1e around the buried plug 7b, formed is a $P^+$-type contact region 16. On the source side of the gate electrode structure, provided are an $N^+$-type source region 17 and an $N^-$-type offset source region 22. On the drain side thereof, provided are an $N^+$-type drain region 18, an N-type offset drain region 21, and an $N^-$-type offset drain region 19.

Figure 18:
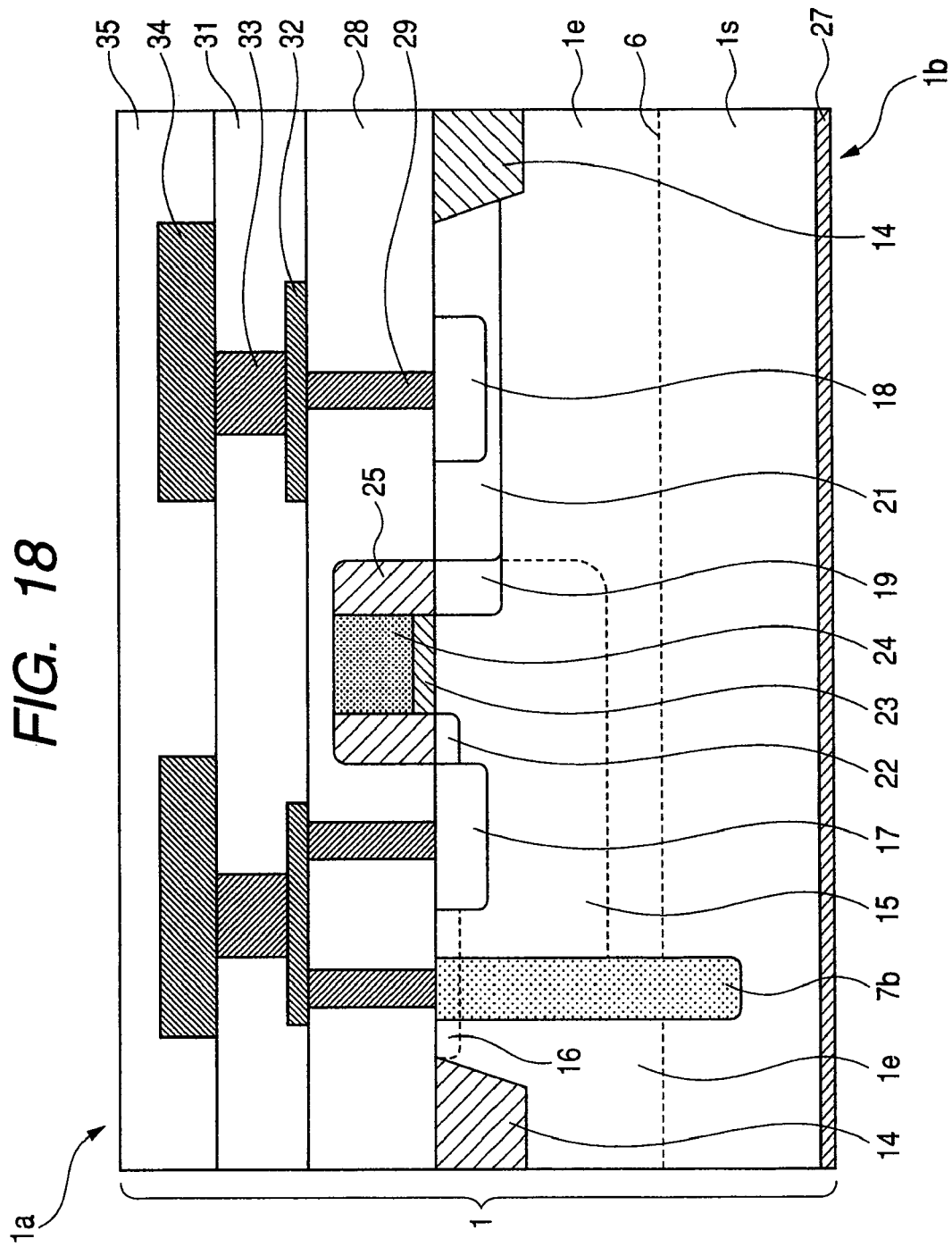
FIG. 18 is a device-process cross-sectional flow diagram (at the time when a wafer process is completed) associated with the method of manufacturing the semiconductor device according to the embodiment of the present invention.

FIG. 18 is a device cross-sectional view at the time when the wafer process is substantially completed (the thickness of the silicon substrate layer is adjusted to, e.g., about 100 micrometers by back grinding), which corresponds to FIG. 17. Over the device surface 1a of the wafer 1 in FIG. 17, formed is a premetal insulating film 28, and tungsten plugs 29 are buried therein. Over the premetal insulating film 28, provided are a first-layer aluminum wiring film 32 and a first-layer interlayer insulating film 31. In the first-layer interlayer insulating film 31, buried are tungsten plugs 33. Likewise, over the first-layer interlayer insulating film 31, provided are a second-layer aluminum wiring film 34 and a final passivation film 35 covering the second-layer aluminum wiring film 34.

On the other hand, over the back surface 1b of the wafer 1, a back-side metal electrode film 27 is formed by sputtering or the like. Specific examples of the back-side metal electrode film 27 that can be shown include a multilayer metal film including a nickel film, a titanium film, a nickel film, and a gold film which are mentioned in the order in which they are formed.

3. Summary

While the invention achieved by the present inventors has been specifically described heretofore based on the embodiment thereof, the present invention is not limited thereto. It will be appreciated that various modifications and changes can be made in the invention within a range not departing from the gist thereof.

For example, in the embodiment described above, the single-element LDMOSFET or the integrated circuit device having the LDMOSFET mounted thereon has been specifically described. However, the present invention is not limited thereto. It will be appreciated that the present invention is widely applicable to a semiconductor device having a silicon-based poly-crystalline member extending through the boundary surface between a plurality of silicon-based mono-crystalline regions having different impurity concentrations or the like. Also, in the present invention, the problem that occurs between the boron-doped substrate, the boron-doped epitaxial region, and the boron-doped silicon-based plug, which is the most realistic problem, has been described specifically. However, the present invention is not limited thereto. It will be appreciated that the present invention is also similarly applicable to a problem that occurs between N-type impurity regions or between an N-type impurity region and a P-type impurity region.

Also, in the embodiment described above, the back-end process has been specifically described using the aluminum-based typical wiring as an example. However, the present invention is not limited thereto. It will be appreciated that the present invention is also applicable to a device using copper-type or silver-type damascene wiring or the like.

What is claimed is:

1. A semiconductor device, comprising:
    (a) a semiconductor substrate comprised of a silicon-based single crystal of a first conductivity type, and having a first main surface and a second main surface;
    (b) a first semiconductor layer provided closer to the second main surface in the semiconductor substrate, and having a first impurity concentration;
    (c) a second semiconductor layer provided closer to the first main surface in the semiconductor substrate so as to come in contact with the first semiconductor layer, and having a second impurity concentration; and
    (d) a silicon-based plug extending from the first main surface through the second semiconductor layer to reach an inside of the first semiconductor layer,
    wherein the plug includes:
    (d1) a poly-crystalline region in a center portion thereof; and
    (d2) a solid-phase epitaxial region including a boundary region between the first and second semiconductor layers, and formed in a vicinity of the boundary in a direction extending between the first and second main surfaces so as to cover a periphery of the poly-crystalline region.

2. A semiconductor device according to claim 1, wherein the first conductivity type is a P-type.

3. A semiconductor device according to claim 1, wherein the plug is doped with boron.

4. A semiconductor device according to claim 1, wherein the second semiconductor layer is an epitaxial layer.

5. A semiconductor device according to claim 1, wherein the first impurity concentration is higher than the second impurity concentration.

6. A semiconductor device according to claim 5, wherein a boron concentration of the plug is higher than the first impurity concentration.

7. A semiconductor device according to claim 1, wherein a length of the portion of the solid-phase epitaxial layer extending from the boundary to the first main surface and a length of the portion of the solid-phase epitaxial layer extending from the boundary to the second main surface are each 200 nm or more.

8. A semiconductor device according to claim 1, wherein the poly-crystalline region is covered with the solid-phase epitaxial region except for an upper surface thereof closer to the first main surface.

9. A semiconductor device according to claim 1, wherein the first impurity concentration is 1000 times or more higher than the second impurity concentration.

10. A semiconductor device according to claim 1, wherein an upper end of the plug is coupled to a $P^+$-type contact region of an LDMOSFET.

* * * * *